United States Patent
Lee et al.

(10) Patent No.: US 11,894,276 B2
(45) Date of Patent: Feb. 6, 2024

(54) MULTIPLE GATE FIELD-EFFECT TRANSISTORS HAVING VARIOUS GATE OXIDE THICKNESSES AND METHODS OF FORMING THE SAME

(71) Applicant: Taiwan Semiconductor Manufacturing Company, Ltd., Hsin-Chu (TW)

(72) Inventors: Chih-Wei Lee, New Taipei (TW); Wen-Hung Huang, Hsinchu (TW); Kuo-Feng Yu, Hsinchu County (TW); Jian-Hao Chen, Hsinchu (TW); Hsueh-Ju Chen, Taipei (TW); Zoe Chen, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 234 days.

(21) Appl. No.: 17/461,849

(22) Filed: Aug. 30, 2021

(65) Prior Publication Data
US 2023/0061018 A1    Mar. 2, 2023

(51) Int. Cl.
*H01L 21/8238* (2006.01)
*H01L 29/423* (2006.01)
(Continued)

(52) U.S. Cl.
CPC ............... *H01L 21/823857* (2013.01); *H01L 21/31105* (2013.01); *H01L 21/823412* (2013.01); *H01L 21/823431* (2013.01); *H01L 21/823437* (2013.01); *H01L 21/823462* (2013.01); *H01L 21/823821* (2013.01); *H01L 27/088* (2013.01);
(Continued)

(58) Field of Classification Search
CPC ......... H01L 21/02148; H01L 21/02181; H01L 21/022; H01L 21/02238; H01L 21/02255; H01L 21/31105; H01L 21/823412; H01L 21/823431; H01L 21/823437; H01L 21/823462; H01L 21/823821; H01L 21/823857; H01L 27/088; H01L 27/0886; H01L 29/0665; H01L 29/42392; H01L 29/66795; H01L 29/785; H01L 29/78696; H01L 21/823807; H01L 27/0922;
(Continued)

(56) References Cited

U.S. PATENT DOCUMENTS 8,796,666 B1    8/2014   Huang et al.
8,815,712 B2    8/2014   Wan et al.
(Continued)

*Primary Examiner* — Cheung Lee
(74) *Attorney, Agent, or Firm* — HAYNES AND BOONE, LLP

(57) ABSTRACT

A method includes providing a structure having a first channel member and a second channel member over a substrate. The first channel member is located in a first region of the structure and the second channel member is located in a second region of the structure. The method also includes forming a first oxide layer over the first channel member and a second oxide layer over the second channel member, forming a first dielectric layer over the first oxide layer and a second dielectric layer over the second oxide layer, and forming a capping layer over the second dielectric layer but not over the first dielectric layer. The method further includes performing an annealing process to increase a thickness of the second oxide layer under the capping layer.

20 Claims, 22 Drawing Sheets

(51) Int. Cl.
    *H01L 29/786*     (2006.01)
    *H01L 29/06*     (2006.01)
    *H01L 21/8234*     (2006.01)
    *H01L 21/311*     (2006.01)
    *H01L 27/088*     (2006.01)

(52) U.S. Cl.
    CPC .... *H01L 29/0665* (2013.01); *H01L 29/42392* (2013.01); *H01L 29/78696* (2013.01)

(58) Field of Classification Search
    CPC ........... H01L 29/0673; H01L 29/66439; H01L 29/66545; H01L 29/775
    See application file for complete search history.

(56) References Cited

U.S. PATENT DOCUMENTS

| | | | |
|---|---|---|---|
| 8,963,258 | B2 | 2/2015 | Yu et al. |
| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |
| 9,576,814 | B2 | 2/2017 | Wu et al. |
| 10,734,286 | B1 * | 8/2020 | Ando ................ H01L 29/0673 |
| 11,056,396 | B1 | 7/2021 | Wu et al. |
| 2013/0285116 | A1 | 10/2013 | Lochtefeld et al. |
| 2015/0214143 | A1 * | 7/2015 | Tsai ................. H01L 21/31144 257/773 |
| 2016/0380056 | A1 * | 12/2016 | Yeo .................. H01L 29/42392 438/283 |
| 2020/0279777 | A1 | 9/2020 | Zhang et al. |
| 2021/0202323 | A1 | 7/2021 | Wu et al. |
| 2021/0225839 | A1 | 7/2021 | Lin et al. |

\* cited by examiner

MULTIPLE GATE FIELD-EFFECT TRANSISTORS HAVING VARIOUS GATE OXIDE THICKNESSES AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as IC technologies progress towards smaller technology nodes, multiple gate devices have been introduced to improve gate control by increasing gate-channel coupling, reducing off-state current, and reducing short-channel effects (SCEs). A multiple gate (or termed as multi-gate) device generally refers to a device having a gate structure, or portions thereof, disposed over more than one side of a channel region. Nanosheet transistors, such as gate-all-around (GAA) transistors, are examples of multi-gate devices that have become popular and promising candidates for high performance and low leakage applications. Compared to planar transistors, such configuration provides better control of the channel and drastically reduces SCEs (in particular, by reducing sub-threshold leakage). A nanosheet transistor has a gate structure that can extend, partially or fully, around a channel region to provide access to the channel region on all sides. In some implementations, the channel region of a nanosheet transistor includes multiple nanosheets (which extend horizontally, thereby providing horizontally-oriented channel members) vertically stacked. The channel region may also be formed from other suitable nanostructures, such as nanowires.

IC devices include transistors in different regions (or areas) that serve different functions, such as input/output (I/O) functions and core functions. These different functions require the transistors to have different constructions. At the same time, it is advantageous to have similar processes and similar process windows to fabricate these different transistors to reduce cost and improve yield. Although existing multiple gate filed-effect transistors and processes are generally adequate for their intended purposes, they have not been entirely satisfactory in every aspect. For example, I/O functions and core functions may prefer different gate oxide layer thicknesses to support high-voltage and high-speed applications, respectively. Therefore, how to continuously scale down gate stacks for I/O devices and core devices with various gate oxide layer thicknesses suiting different applications is a challenge faced by the semiconductor industry. The present disclosure aims to solve the above issues and other related issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
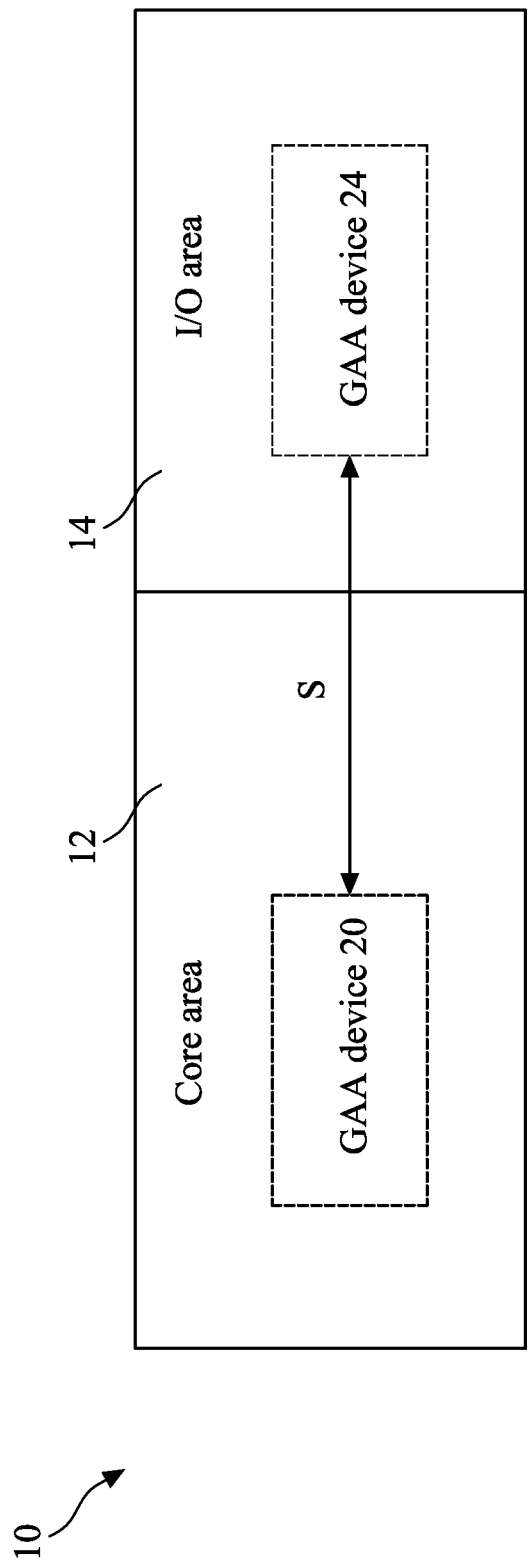
FIGS. 1A and 1B shows a schematic block diagram of a semiconductor device and respective fragmentary cross-sectional view of two multi-gate transistors in core and I/O areas, according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices, and more particularly to integrate circuits (IC) having input/output (I/O) devices (or transistors) and core devices (or transistors) with nanosheet channels on the same substrate. In an embodiment, at least one gate-all-around (GAA) device with stacked nanosheet channels is placed in a core area of the IC, for example, for implementing high-speed application, while at least one GAA device is placed in an I/O area of the IC for implementing I/O application or electrostatic discharge (ESD) application.

Operating voltage for the I/O area may be similar to external voltage (voltage level of the external/peripheral circuitry) and is higher than the operating voltage of the core area. To accommodate the higher operating voltage, transistors in the I/O area may have a thick gate oxide layer as compared to their counterparts in the core area. In the core area, thickness of a gate oxide layer correlates with transistor's speed and leakage performance. With a thin gate oxide layer, a GAA device is more suitable for high-speed application. To further the embodiment, the GAA device in the I/O area has a gate oxide layer thicker than that of the GAA device in the core area. Embodiments of the present disclosure provide flexible design integration schemes to accommodate different circuits in the same IC. Fabrication methods according to the present disclosure can be readily integrated into existing semiconductor manufacturing flows. Details of the various embodiments of the present disclosure are described by reference to the FIGS. 1A-20.

Figure 1B:
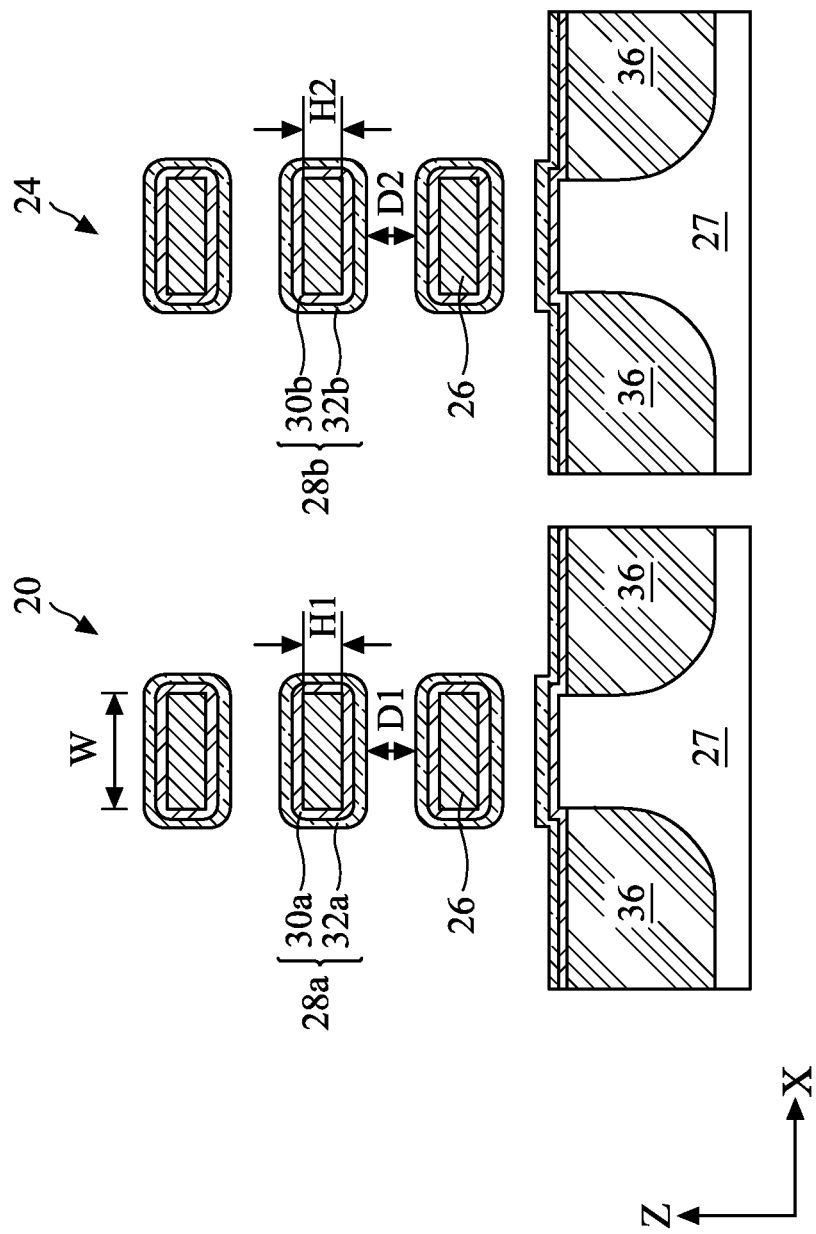

Referring to FIGS. 1A and 1B collectively, shown therein is a schematic block diagram of a semiconductor structure 10 (e.g., an IC 10) constructed according to an embodiment of the present disclosure. The IC 10 includes a core area 12 and an I/O area 14. The core area 12 includes logic circuits, memory circuits, and other core circuits. The I/O area 14 includes I/O cells, ESD cells, and other circuits. The core area 12 includes a device region where at least a GAA device 20 is formed. The I/O area 14 includes a device region where at least a GAA device 24 is formed. In some embodiments, the core area 12 and the I/O area 14 are placed adjacent to each other. In some other embodiments, the core area 12 and the I/O area 14 are separated, such as by other core or I/O areas therebetween.

Each of the GAA devices 20 and 24 includes vertically stacked multiple channel members 26 above the substrate 27, as illustrated in FIG. 1B, which is a fragmentary cross-sectional view. The number of channel members 26 in each GAA device may be in a range of 2 to 10. Each of the channel members 26 includes silicon or another suitable semiconductor material. The channel members 26 of the GAA device 20 are wrapped around by a gate dielectric layer 28a, which includes an interfacial layer (also referred to as gate oxide layer) 30a and a high-k dielectric layer 32a. The channel members 26 of the GAA device 24 are wrapped around by a gate dielectric layer 28b, which includes an interfacial layer 30b and a high-k dielectric layer 32b. Gate electrodes (not shown) wrap around or over each of the gate dielectric layers 28a and 28b. The gate electrode may include one or more work function metal layers and a bulk metal layer. The GAA device 20 is located away from the GAA device 24 at least by spacing "S." In the illustrated embodiment, spacing S is about four (4) times of a width "W" of the channel member 26. The spacing S is designed to ease manufacturing process by providing margins when patterning the device regions in core and I/O areas.

The GAA devices 20 and 24 have different gate oxide layer thicknesses. For example, the GAA device 20 in the core area 12 includes a thin gate oxide layer 30a, which suits high-speed applications; the GAA device 24 in the I/O area 14 includes a thick gate oxide layer 30b, which suits high-voltage applications. As an example, the gate oxide layer 30b may be about 30% to about 50% thicker than the gate oxide layer 30a. In a particular example, the gate oxide layer 30a has a thickness ranging from about 5 Å (Angstrom) to about 20 Å, and the interfacial layer 30b has a thickness that has a ratio about 1.3:1 to about 1.5:1 of the thickness of the interfacial layer 30a. If the gate oxide layer 30b is less than 30% thicker than the gate oxide layer 30a, the high-voltage performance may be degraded; if the interfacial layer 30b is larger than 50% thicker than the interfacial layer 30a, the gate drive capability of the I/O device may be weakened due to relatively large gate oxide thickness. As to be explained in further detail below, the extra thickness of the interfacial layer 30b results from a gate oxide regrowth process in converting top portions of crystalline silicon of the channel member 26 to silicon oxide in the I/O area 14. Accordingly, a thickness "H1" of the channel members 26 in the core area 12 may be larger than a thickness "H2" of the channel members 26 in the I/O area 14, such as about 1.5 Å to about 2.5 Å larger in some embodiments. Further, within gate dielectric layers 28a and 28b, the high-k dielectric layers 32a and 32b may have substantially the same thickness (e.g., from about 20 Å to about 100 Å), while the gate oxide layer 30a is thinner than the gate oxide layer 30b, such that the gate dielectric layer 28a is thinner than the gate dielectric layer 28b. To further the embodiment, a distance "D1" between neighboring gate dielectric layers 28a wrapping stacked channel members 26 of the GAA device 20 is larger than a distance "D2" between neighboring gate dielectric layers 28b wrapping stacked channel members 26 of the GAA device 24.

Figure 2A:
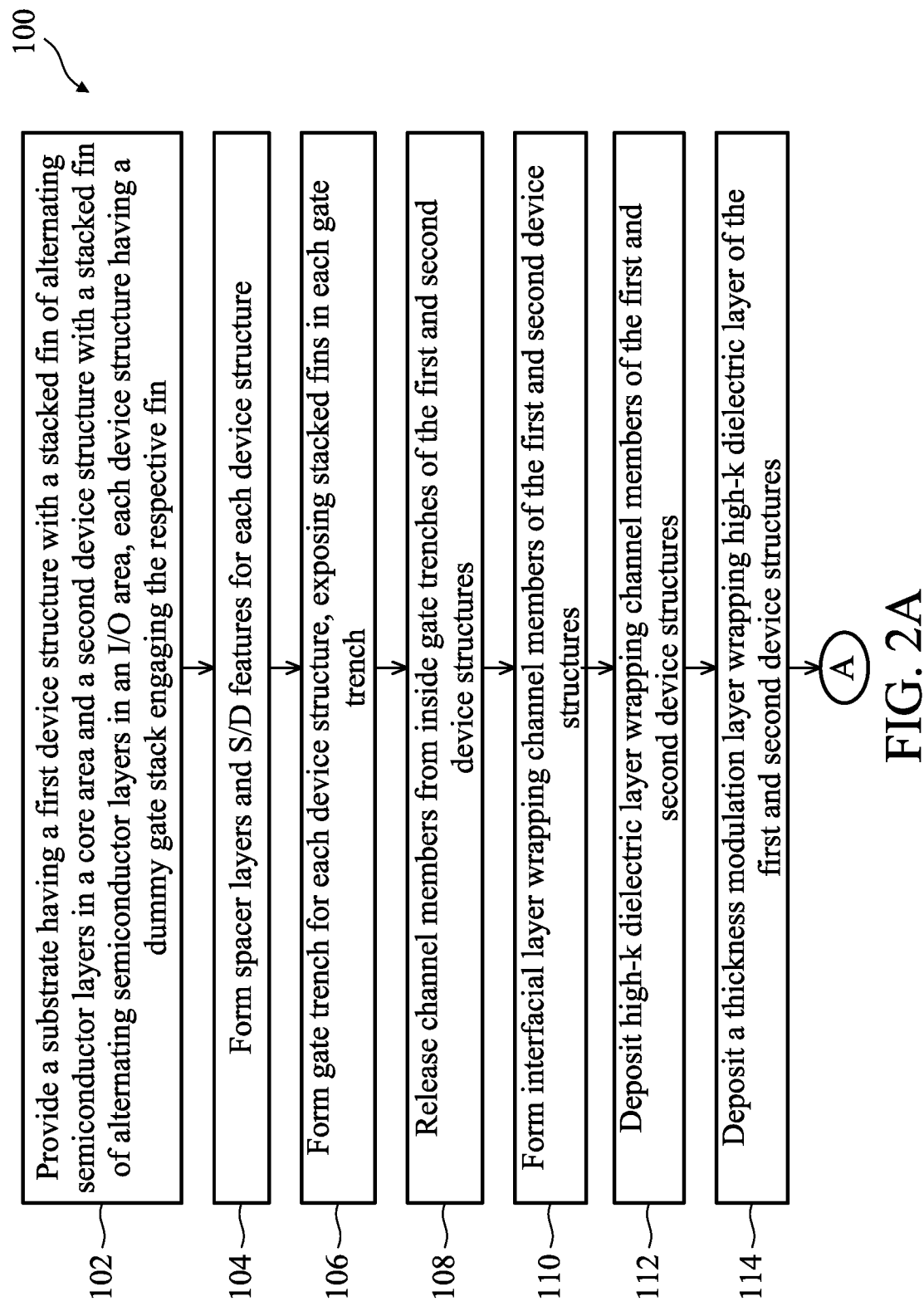
FIGS. 2A and 2B show a flow chart of a method for forming the multi-gate transistors shown in FIGS. 1A-B, according to aspects of the present disclosure.
Figure 2B:
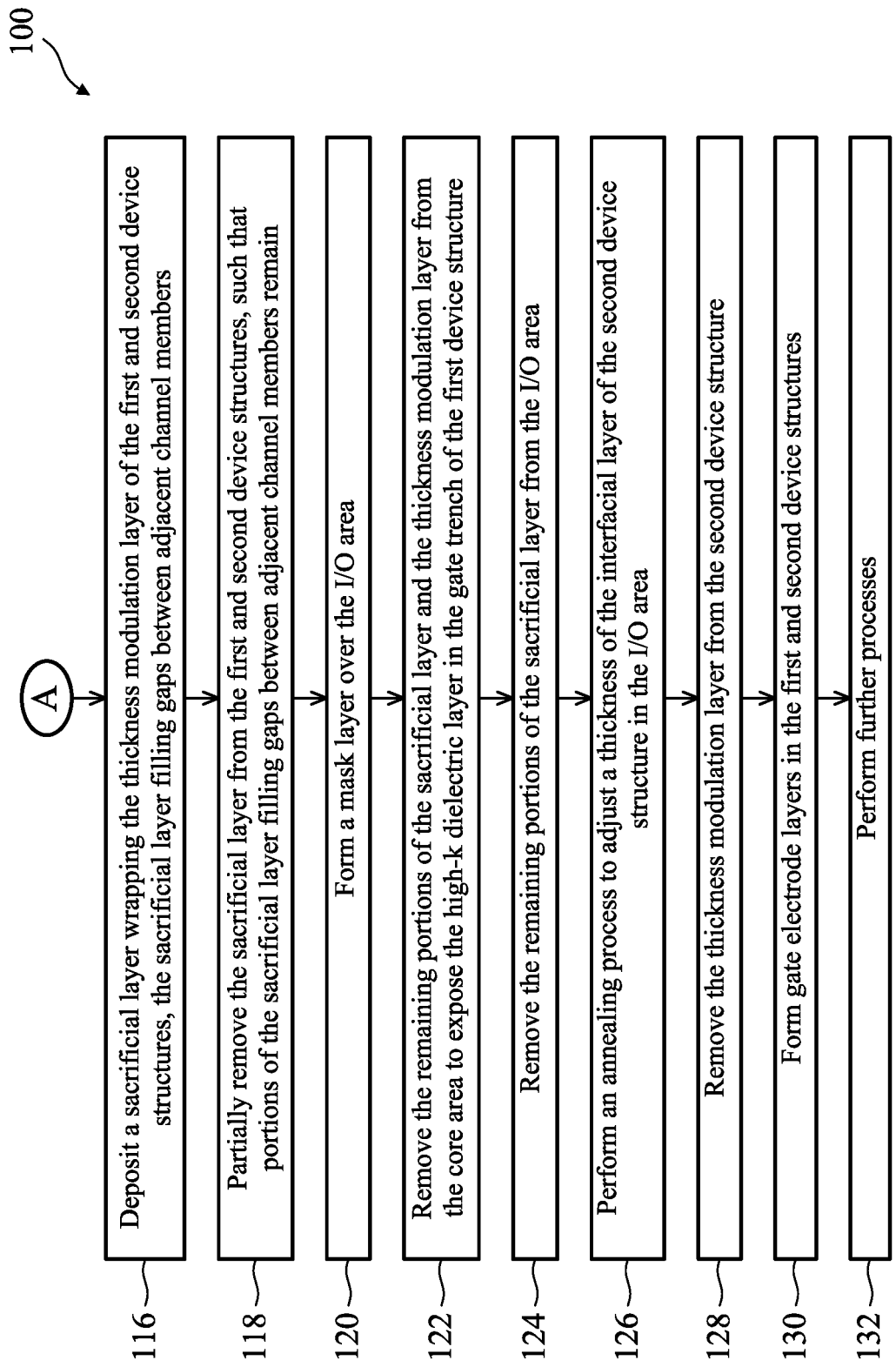

FIGS. 2A and 2B illustrate a flow chart of a method 100 for forming multi-gate transistors according to various aspects of the present disclosure. FIGS. 2A and 2B will be described below in conjunction with FIGS. 3-20, which are fragmentary perspective and cross-sectional views of a workpiece at various stages of fabrication according to method 100. The method 100 is merely an example, and is not intended to limit the present disclosure beyond what is explicitly recited in the claims. Additional steps can be provided before, during, and after method 100, and some of the steps described can be moved, replaced, or eliminated for additional embodiments of method 100. Additional features can be added in the semiconductor device depicted in FIGS. 3-20 and some of the features described below can be replaced, modified, or eliminated in other embodiments of the semiconductor device.

Figure 3:
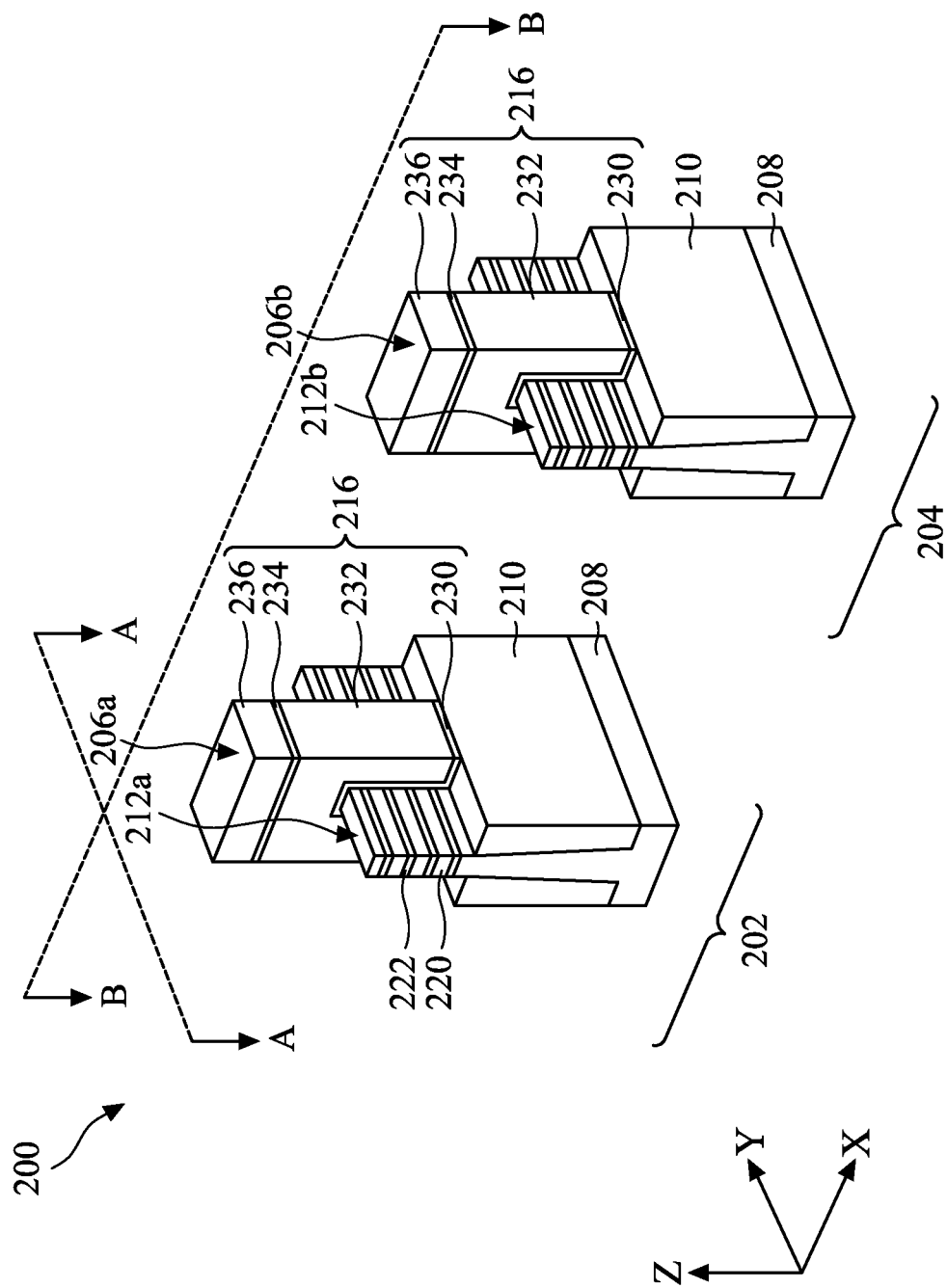
FIG. 3 shows a diagrammatic perspective view of a semiconductor device, according to aspects of the present disclosure.

At operation 102, the method 100 (FIG. 2A) provides a semiconductor structure 200 (or semiconductor device 200) that includes a first area 202 and a second area 204, as shown in FIG. 3. Each of the areas 202 and 204 includes device regions that include transistors serving different functions. In some embodiments, the first area 202 is a core area and the second area 204 is an input/output (I/O) area. In those embodiments, a core area (or core region) refers to a device area that includes logic cells, such as inverter, NAND, NOR, AND, OR, and Flip-Flop, as well as memory cells, such as static random access memory (SRAM), dynamic random access memory (DRAM), and Flash. An I/O area (or I/O region) refers to a device area that interfaces between a core device area and external/peripheral circuitry, such as the circuit on the printed circuit board (PCB) on which the semiconductor device 200 is mounted. In the illustrated embodiment, the core area 202 includes a GAA core device structure 206a for forming a first GAA transistor for high-speed application; the I/O area 204 includes a GAA I/O device structure 206b for forming a second GAA transistor for I/O or ESD application.

Each of the device structures 206a and 206b includes a substrate 208, an isolation structure 210, a fin 212a or 212b that comprises alternating semiconductor layers 220 and 222 vertically stacked (also refer to as stacked fin 212a or 212b), and a dummy gate structure 216 engaging the stacked fin 212a or 212b.

In some embodiments, the substrate 208 includes silicon. Alternatively or additionally, substrate 208 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, the substrate 208 includes one or more group III-V materials, one or more group II-IV materials, or combinations thereof. In some implementations, the substrate 208 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 208 can include various doped regions configured according to design requirements of semiconductor device 200. P-type doped regions may include p-type dopants, such as boron, indium, other p-type dopant, or combinations thereof. N-type doped regions may include n-type dopants, such as phosphorus, arsenic, other n-type dopant, or combinations thereof. In some implementations, the substrate 208 includes doped regions formed with a combination of p-type dopants and n-type dopants. The various doped regions can be formed directly on and/or in substrate 208, for example, providing a p-well structure, an n-well structure, a dual-well structure, a raised structure, or combinations thereof. An ion implantation process, a diffusion process, and/or other suitable doping process can be performed to form the various doped regions. In some embodiments, p-type GAA devices and/or p-type FinFET devices are formed over n-type wells, while n-type GAA devices and/or n-type FinFET devices are formed over p-type wells. Each of the device structures 206a and 206b may individually be an n-type or a p-type device.

The isolation structure 210 may comprise silicon oxide, silicon nitride, silicon oxynitride, fluoride-doped silicate glass (FSG), a low-k dielectric material, and/or other suitable insulating material. The isolation structure 210 may be shallow trench isolation (STI) features. Other isolation structure such as field oxide, LOCal Oxidation of Silicon (LOCOS), and/or other suitable structures are possible. The isolation structure 210 may include a multi-layer structure, for example, having one or more thermal oxide liner layers.

Each of the stacked fins 212a and 212b has semiconductor layers 220 and 222 alternately stacked. The first semiconductor material in the semiconductor layers 220 is different from the second semiconductor material in the semiconductor layers 222, in material and/or composition. Each of the first semiconductor material and the second semiconductor material may include silicon, germanium, a compound semiconductor including silicon carbide, gallium arsenic, gallium phosphide, indium phosphide, indium arsenide, and indium antimonide, or an alloy semiconductor including SiGe, GaAsP, AlInAs, AlGaAs, GaInAs, GaInP, and GaInAsP. In the present embodiment, the semiconductor layers 220 comprise silicon, and the semiconductor layers 222 comprise germanium or silicon germanium alloy. The semiconductor layers 220 and 222 in the stacked fins 212a and 212b may additionally include dopants (e.g., phosphorus, arsenic, boron, and/or indium) for improving the performance of the GAA transistors to be formed.

The stacked fins 212a and 212b can be formed by epitaxially growing the semiconductor layers 220 and 222 over the substrate 208 and then patterned by any suitable method to form the individual stack fins 212a and 212b. For example, the stacked fins 212a and 212b may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the stacked fins 212a and 212b by etching the initial semiconductor layers 220, 222 and the substrate 208. The etching process can include dry etching, wet etching, reactive ion etching (RIE), and/or other suitable processes. In the illustrated embodiment, stacked fins 212a and 212b extend lengthwise in the same direction (longitudinal axes are parallel). In some embodiments, the stacked fins 212a in the core area 202 extend lengthwise in one direction (e.g., along Y-direction), while the stack fin 212b in the I/O area 204 may extend lengthwise in a different direction, such as in a perpendicular direction (e.g., along X-direction) or other directions.

The dummy gate structure 216 reserves an area for a metal gate stack and includes a dummy interfacial layer 230, a dummy gate electrode 232, a first gate hard mask layer 234, and a second gate hard mask layer 236. The dummy interfacial layer 230 is formed over top and sidewall surfaces of each of the stacked fins 212a and 212b and over the top surface of the isolation structure 210. The dummy interfacial layer 230 may include a dielectric material such as an oxide layer (e.g., $SiO_2$) or oxynitride layer (e.g., SiON), and may be deposited by chemical oxidation, thermal oxidation, atomic layer deposition (ALD), chemical vapor deposition (CVD), and/or other suitable methods.

The dummy gate electrode 232 may include poly-crystalline silicon (poly-Si) and may be formed by suitable deposition processes such as low-pressure chemical vapor deposition (LPCVD) and plasma-enhanced CVD (PECVD). Each of the gate hard mask layers 234 and 236 may include one or more layers of dielectric material such as silicon oxide and/or silicon nitride, and may be formed by CVD or other suitable methods. For example, the first gate hard mask layer 234 may include a silicon oxide layer adjacent the dummy gate electrode 232 and the second gate hard mask layer 236 may include a silicon nitride layer. The various layers 230, 232, 234, and 236 may be patterned by photolithography and etching processes.

Figure 4:
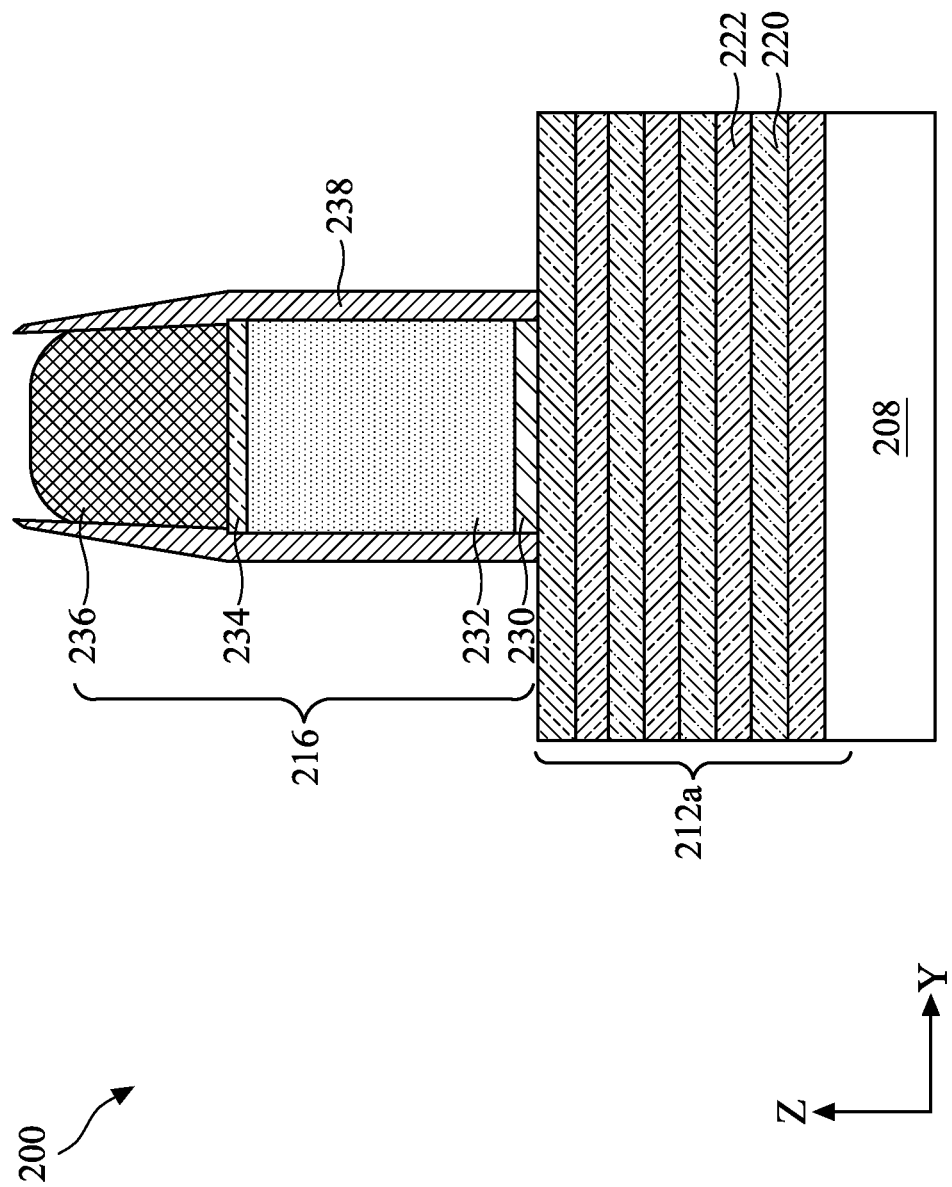
FIGS. 4, 5, 6, 7, 8, 9, 10, 11, 12, 13, 14, 15, 16, 17, 18, 19, and 20 illustrate cross-sectional views of a semiconductor structure during fabrication processes according to the method of FIGS. 2A and 2B, in accordance with various embodiments of the present disclosure.
Figure 5:
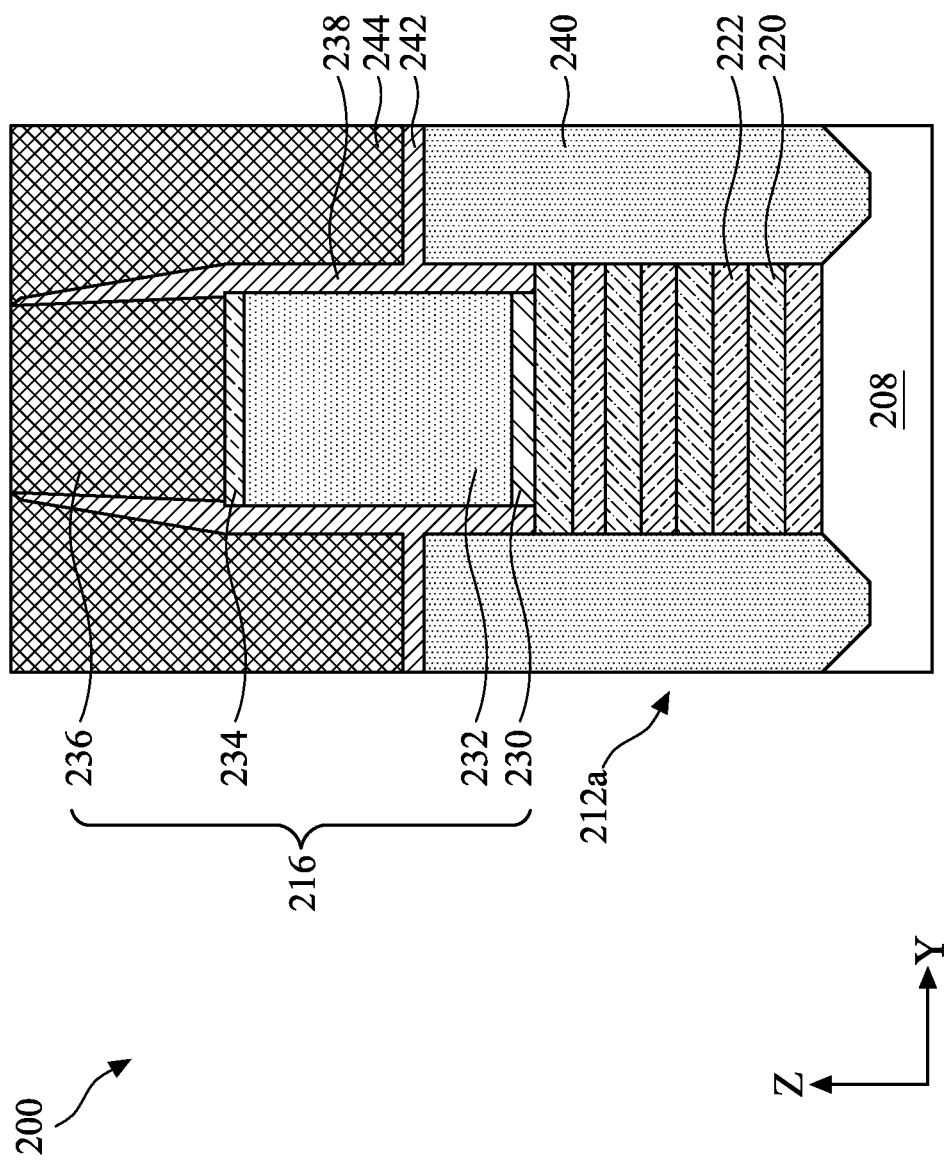
Figure 6:
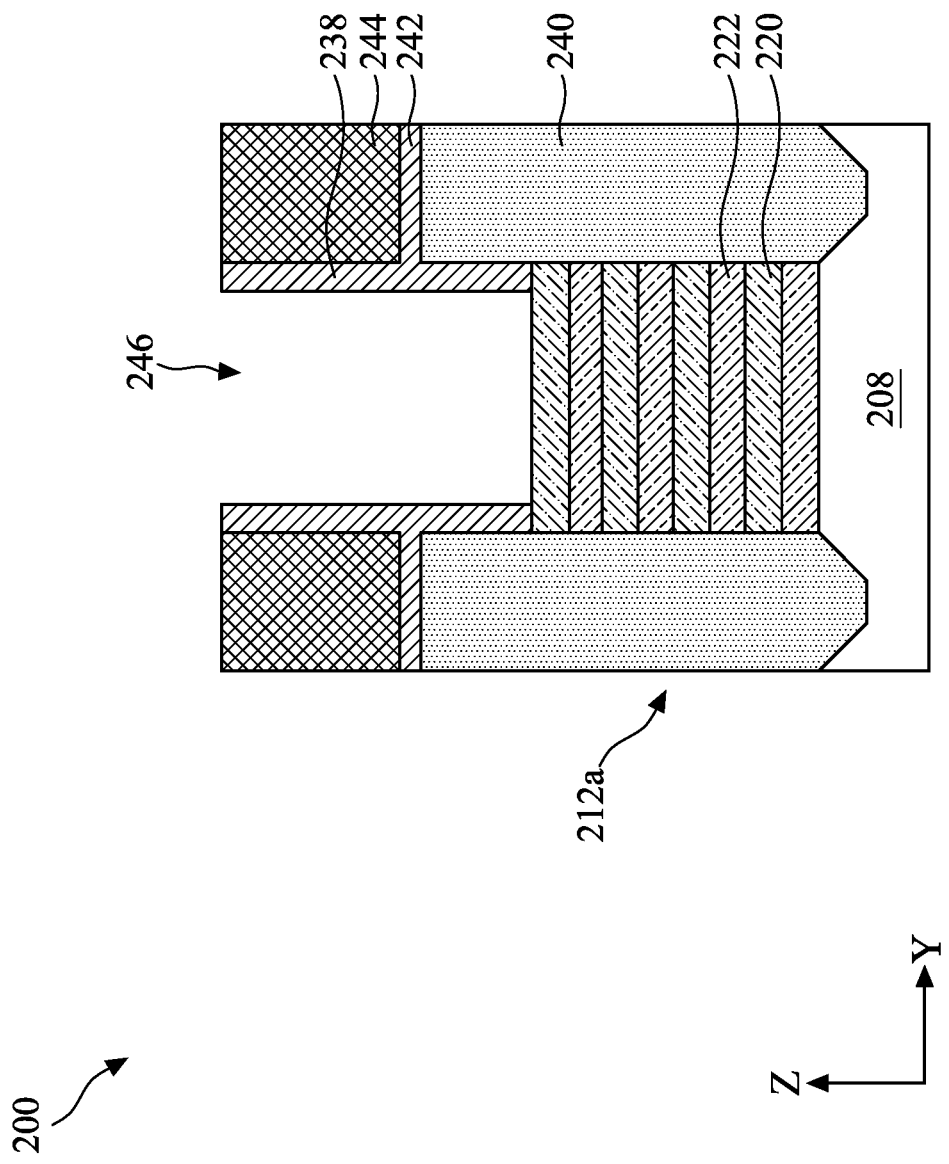

For clarity of description and illustration, FIGS. 4-6 include fragmentary cross-sectional views of the GAA core device structure 206a along the section A-A shown in FIG. 3, which passes the respective channel region along the lengthwise direction of the stacked fin 212a (in Y-Z plane). Cross-sectional views of the GAA I/O device structure 206b in Y-Z plane are similar to what is illustrated in FIGS. 4-6 and omitted for simplicity. FIGS. 7-20 include fragmentary cross-sectional views of the semiconductor device 200 along the section B-B shown in FIG. 3, which passes multiple channel regions along a direction perpendicular to the lengthwise direction of the stacked fins 212a and 212b (in X-Z plane).

At operation 104, the method 100 (FIG. 2A) forms gate spacers 238 over the sidewalls of the dummy gate structure 216, as shown in FIG. 4. The gate spacers 238 may comprise a dielectric material, such as silicon oxide, silicon nitride, silicon oxynitride, silicon carbide, other dielectric material, or combinations thereof, and may comprise one or multiple layers of material. The gate spacers 238 may be formed by depositing a spacer material as a blanket over the semiconductor device 200. Then the spacer material is etched by an anisotropic etching process. Portions of the spacer material on the sidewalls of the dummy gate structure 216 become the gate spacers 238. Operation 104 further forms S/D features 240 in the S/D regions, as shown in FIG. 5. For example, operations 104 may etch recesses into the stacked fins 212a and 212b, and epitaxially grow semiconductor materials in the recesses. The semiconductor materials may be raised above the top surface of the respective fins. Operation 104 may form the S/D features 240 separately for n-type and p-type devices. For example, Operation 104 may form the S/D features 240 with an n-type doped silicon for n-type devices, and with a p-type doped silicon germanium for p-type devices. Operation 104 may further form contact etch stop (CESL) layer 242 over the S/D features 240 and inter-layer dielectric (ILD) layer 244 over the CESL layer 242. The CESL layer 242 may comprise silicon nitride, silicon oxynitride, silicon nitride with oxygen (O) or carbon (C) elements, and/or other materials; and may be formed by CVD, PVD (physical vapor deposition), ALD, or other suitable methods. The ILD layer 244 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be formed by PECVD or FCVD (flowable CVD), or other suitable methods. A CMP process may follow operation 104 to remove excessive dielectric materials. In some embodiments, the CMP process also removes the gate hard masks 234 and 236 and exposes the dummy gate electrode 232.

Figure 7:
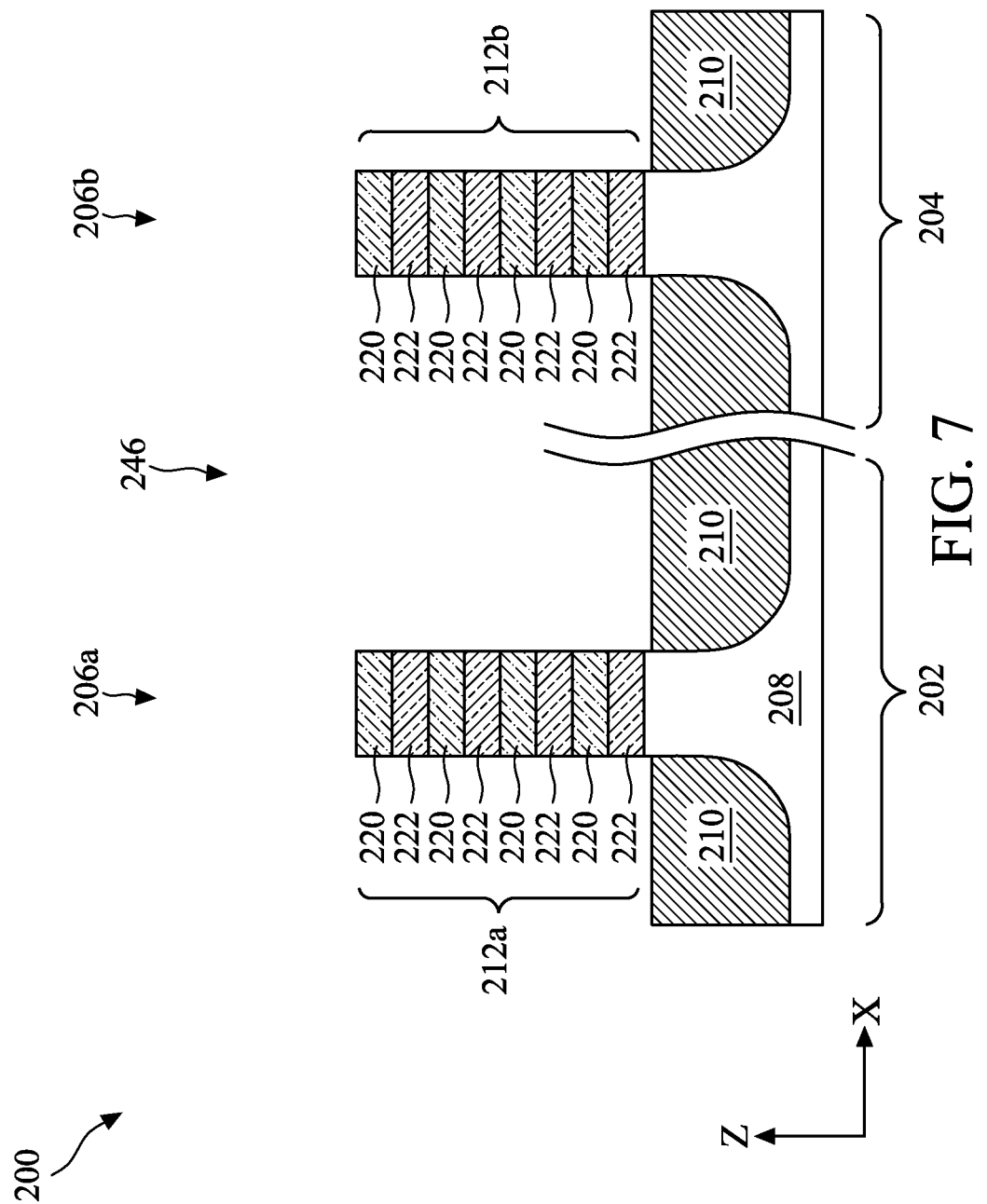

At operation 106, the method 100 (FIG. 2A) removes the dummy gate electrode 232 and the dummy interfacial layer 230, resulting in gate trenches 246, as shown in FIG. 6. Operation 106 may include one or more etching processes that are selective to the material in the dummy gate electrode 232 and the dummy interfacial layer 230. By selecting an etchant that resists etching the gate spacers 238 and ILD layer 244, portions of the gate spacers 238 and ILD layer 244 are exposed in the gate trenches 246 without substantial etching loss. This may increase the tolerance of the photolithographic process. The etching process may include any suitable etching technique such as wet etching, dry etching, RIE, ashing, and/or other etching methods. In an example, the etching process is a dry etching process using a fluorine-based etchant (e.g., $CF_4$, $CHF_3$, $CH_2F_2$, etc.). After operation 106, the stacked fins 212a and 212b are exposed in the gate trenches 246, as shown in FIG. 7.

Figure 8:
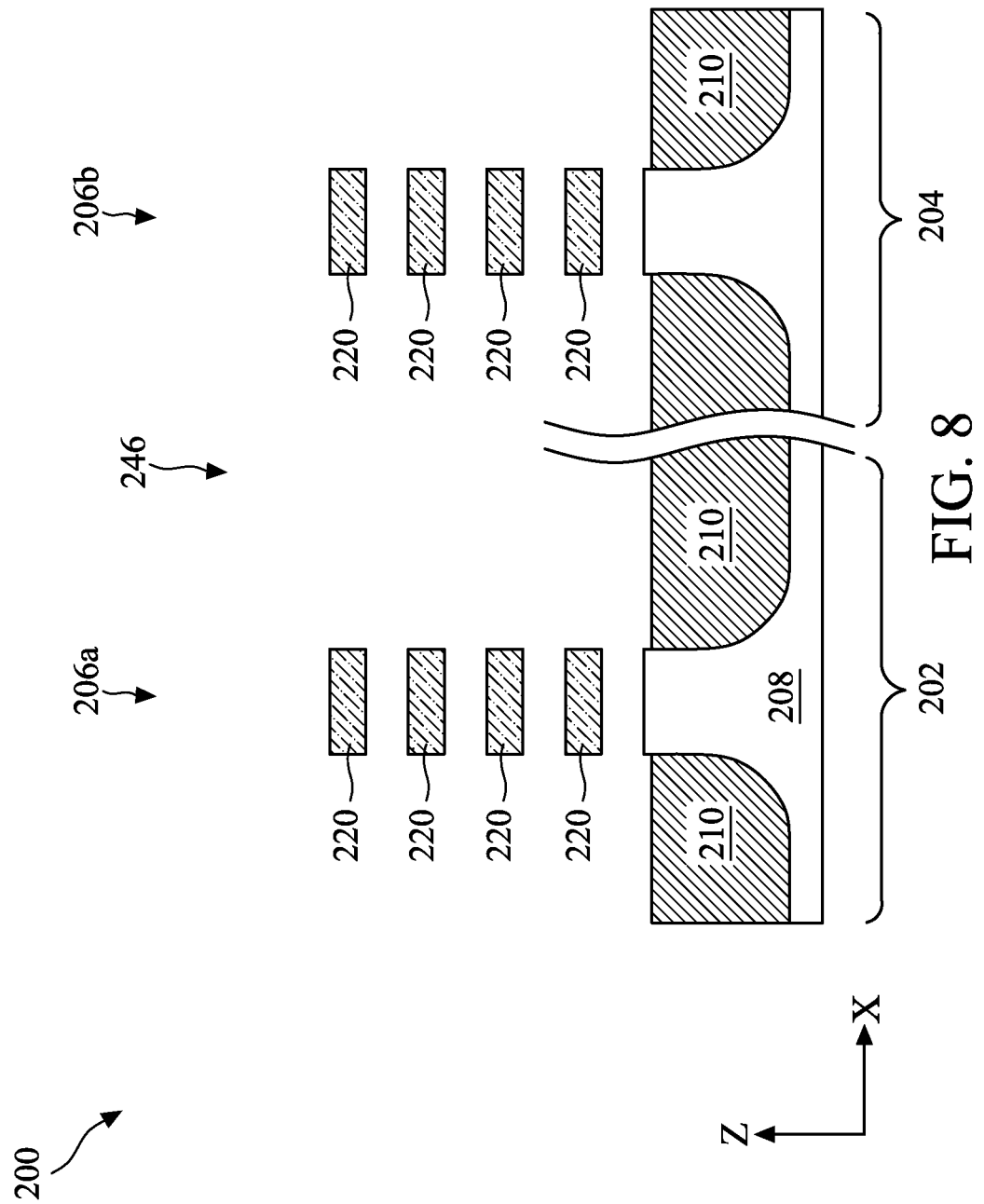
Figure 9:
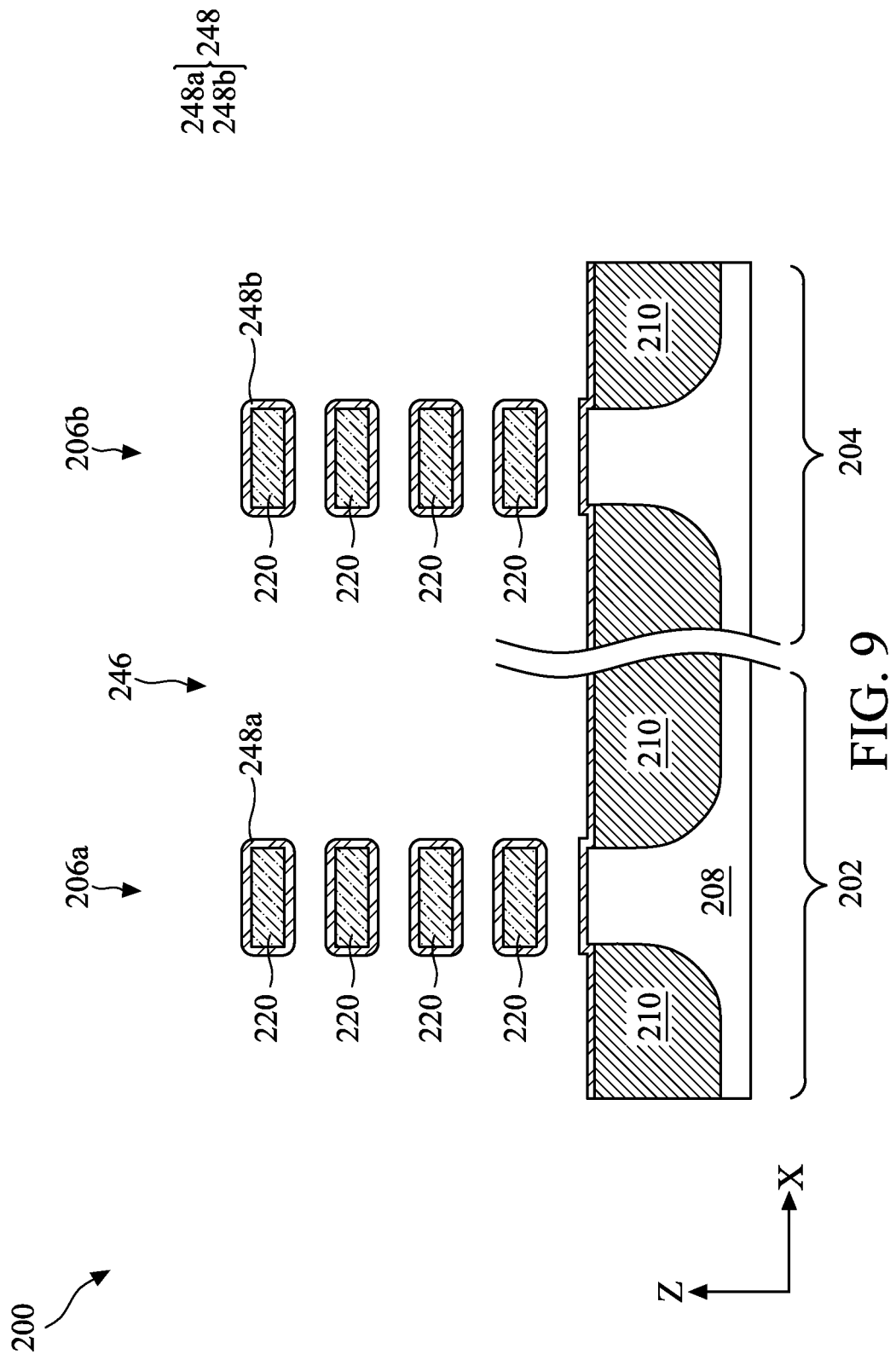

At operation 108, the method 100 (FIG. 2A) releases channel members in the channel regions of the GAA device structures 206a and 206b from the gate trenches 246, as shown in FIG. 8. In the illustrated embodiment, channel members are nanosheets. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. For the sake of simplicity and clarity, the semiconductor layers 220 are denoted as nanosheets 220 after operation 108. In the present embodiment, the semiconductor layers 220 include crystalline silicon, and the semiconductor layers 222 include silicon germanium. The plurality of semiconductor layers 222 may be selectively removed. In some implementations, the selectively removal process includes oxidizing the plurality of semiconductor layers 222 using a suitable oxidizer, such as ozone ($O_3$). Thereafter, the oxidized semiconductor layers 222 may be selectively removed. To further this embodiment, the operation 110 includes a dry etching process to selectively remove the semiconductor layers 222, for example, by applying an HCl gas at a temperature of 500° C. to 700° C., or applying a gas mixture of $CF_4$, $SF_6$, and $CHF_3$. At this point, as shown in FIG. 8, vertically stacked nanosheets 220 are formed in the channel regions of the GAA core device structure 206a and in the channel region of the GAA I/O device structure 206b. Although FIG. 8 illustrates four nanosheets 220 for each stack, there may be less or more vertically stacked nanosheets 220 in various embodiments. For example, the number of nanosheets 220 in each GAA device structure may be in a range of 2 to 10.

At operation 110, the method 100 (FIG. 2A) forms a gate oxide layer (or referred to as interfacial layer) 248 on the nanosheets 220 and wrapping all the nanosheets 220. The gate oxide layer 248 may include silicon oxide ($SiO_2$), which may be formed by plasma-enhanced atomic layer deposition. Alternatively, the gate oxide layer 248 may be formed by CVD, thermal oxidation using water steam ($H_2O$) or $O_2$, or gas phase or liquid phase chemical oxidation using an oxidizing agent such as hydrogen peroxide ($H_2O_2$) or ozone ($O_3$). The gate oxide layer 248 has a thickness suitable for core applications, such as a thickness ranging from about 5 Å and about 20 Å. Thicknesses of the gate oxide layer 248 over the core area 202 and the I/O area 204 are substantially the same at this stage. For the sake of clarity, the portion of the gate oxide layer 248 wrapping the nanosheets 220 of the GAA core device structure 206a is denoted as the gate oxide layer 248a; the other portion of the gate oxide layer 248 wrapping the nanosheets 220 of the GAA I/O device structure 206b is denoted as the gate oxide layer 248b.

Figure 10:
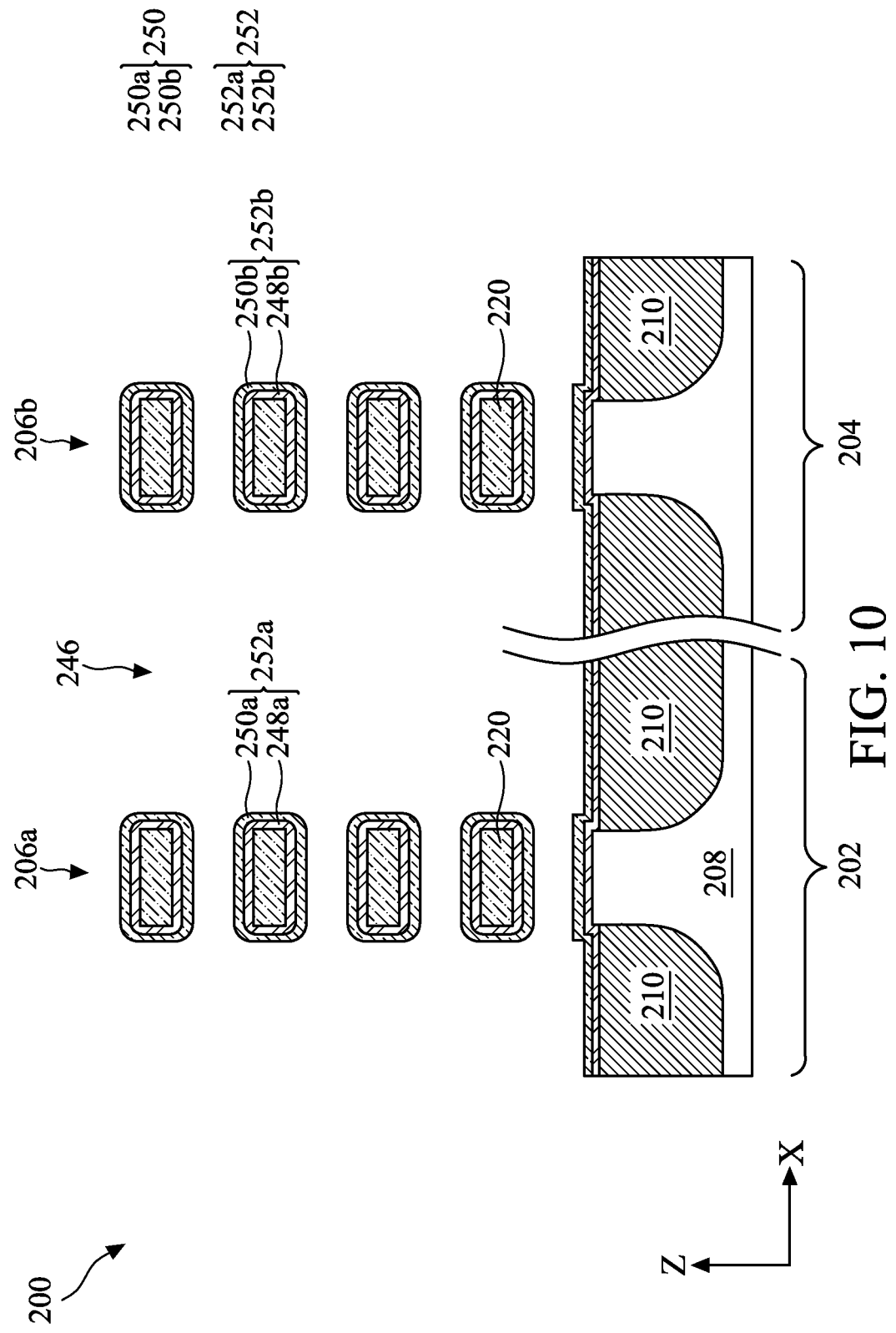

At operation 112, the method 100 (FIG. 2A) forms a high-k dielectric layer 250 in the gate trenches 246, as shown in FIG. 10, thereby forming gate dielectric layers 252a and 252b (collectively, gate dielectric layers 252) in channel regions of the GAA core device structure 206a and the GAA I/O device structure 206b, respectively. For the sake of clarity, the portion of the high-k dielectric layer 250 wrapping the gate oxide layer 248a of the GAA core device structure 206a is denoted as the high-k dielectric layer 250a; the other portion of the high-k dielectric layer 250 wrapping the gate oxide layer 248b of the GAA I/O device structure 206b is denoted as the high-k dielectric layer 250b. In other words, the gate dielectric layer 252a includes the gate oxide layer 248a wrapping the nanosheets 220 of the GAA core device structure 206a and the high-k dielectric layer 250a wrapping the gate oxide layer 248a, while the gate dielectric layer 252b includes the gate oxide layer 248b wrapping the nanosheets 220 of the GAA I/O device structure 206b and the high-k dielectric layer 250b wrapping the gate oxide layer 248b. The gate oxide layers 248a and 248b and the high-k dielectric layers 250a and 250b are deposited as substantially conformal layers in the illustrated embodiment. Thicknesses of the high-k dielectric layer 250 over the core area 202 and the I/O area 204 are substantially the same. The high-k dielectric layers 250 may be deposited using any suitable technique, such as ALD, CVD, metal-organic CVD (MOCVD), PVD, thermal oxidation, combinations thereof, and/or other suitable techniques. The high-k dielectric layer 250 may include a metal oxide (e.g., LaO, AlO, ZrO, TiO, $Ta_2O_5$, $Y_2O_3$, $SrTiO_3$ (STO), $BaTiO_3$ (BTO), BaZrO, HfZrO, HfLaO, HfTaO, HfTiO, $(Ba,Sr)TiO_3$ (BST), $Al_2O_3$, etc.) a metal silicate (e.g., HfSiO, LaSiO, AlSiO, etc.), a metal or semiconductor nitride, a metal or semiconductor oxynitride, combinations thereof, and/or other suitable materials. In a specific example, the high-k dielectric layer 250 has a thickness ranging from about 30 Å to about 100 Å.

Figure 11:
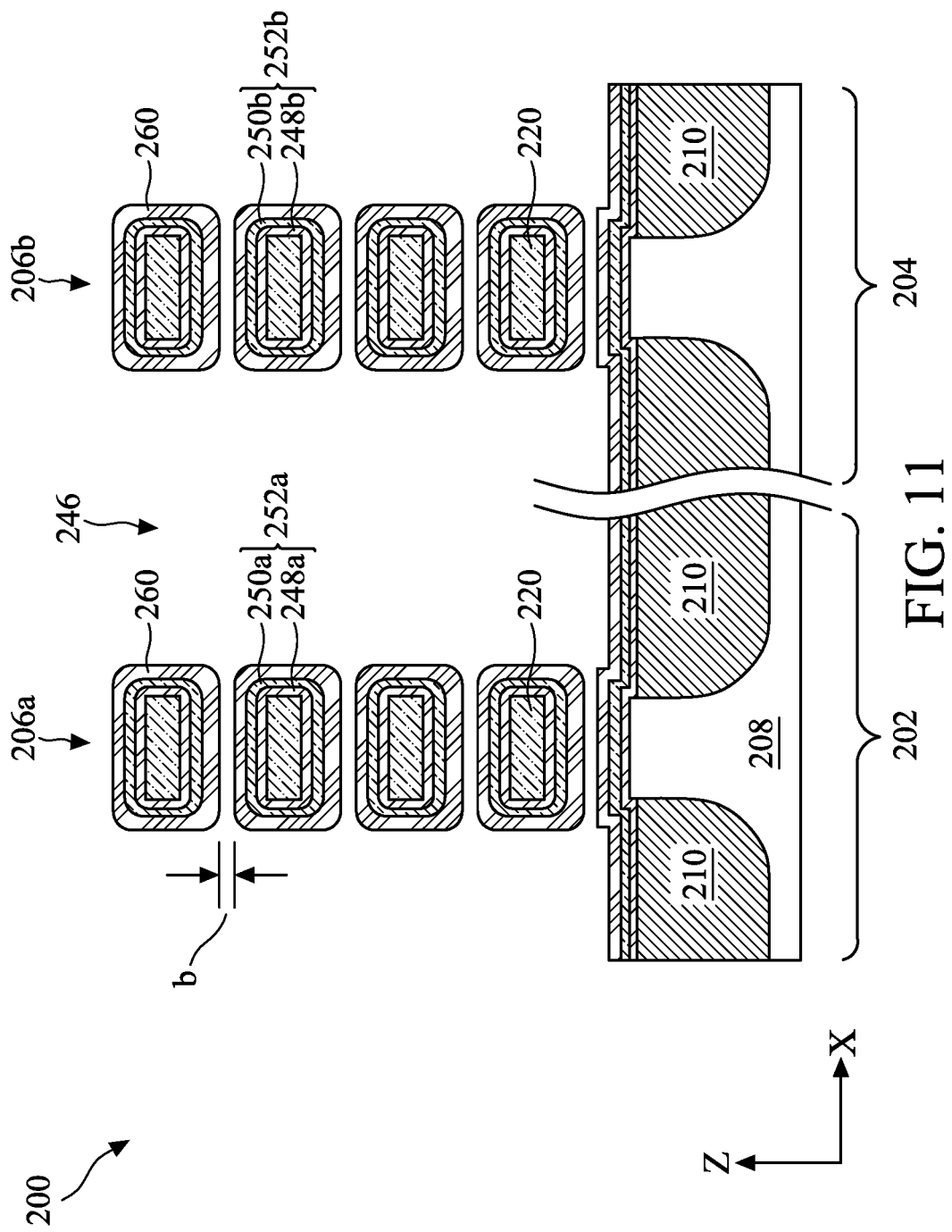

At operation 114, the method 100 (FIG. 2A) deposits a thickness modulation layer 260 in both the core area 202 and the I/O area 204, as shown in FIG. 11. The thickness modulation layer 260 wraps the gate dielectric layers 252a and 252b and is also referred to as a capping layer 260. The thickness modulation layer 260 may include one or more material layers. The thickness modulation layer 260 includes material(s) that has higher affinity for oxygen from ambient environment. As will be explained in further detail below, the thickness modulation layer 260 will facilitate transferring oxygen from ambient environment to top portions of crystalline silicon of the nanosheets 220 that are beneath the gate oxide layer 248b for a gate oxide regrowth process. The thickness modulation layer 260 may be a metal layer that includes a metal or a metal compound (e.g., metal nitride) such as TiN, AlN, WN, or combinations thereof such as TiAlN or TiALC. The thickness modulation layer 260 may also be formed of a metal oxide, such as TiO, AlO, or combinations thereof. The deposition methods include physical vapor deposition, CVD, ALD, or other suitable methods. A thickness of the thickness modulation layer 260 is selected such that the gap between adjacent wrapped channel members (with vertical distance "d" denoted in FIG. 11) is not closed. In some embodiments, the vertical distance d is at least 0.9 nm, which allows oxygen from ambient environment to be absorbed by the thickness modulation layer 260 from all directions and substantially evenly delivered to the nanosheets 220 underneath. The thickness modulation layer 260 may have a thickness ranging from about 10 Å to about 30 Å. A thickness less than 10 Å may not be able to provide sufficient oxygen affinity, while a thickness larger than 30 Å may close the gaps between adjacent wrapped channel members or require a larger distance between channel members to accommodate such a thick capping layer which increases device aspect ratio.

Figure 12:
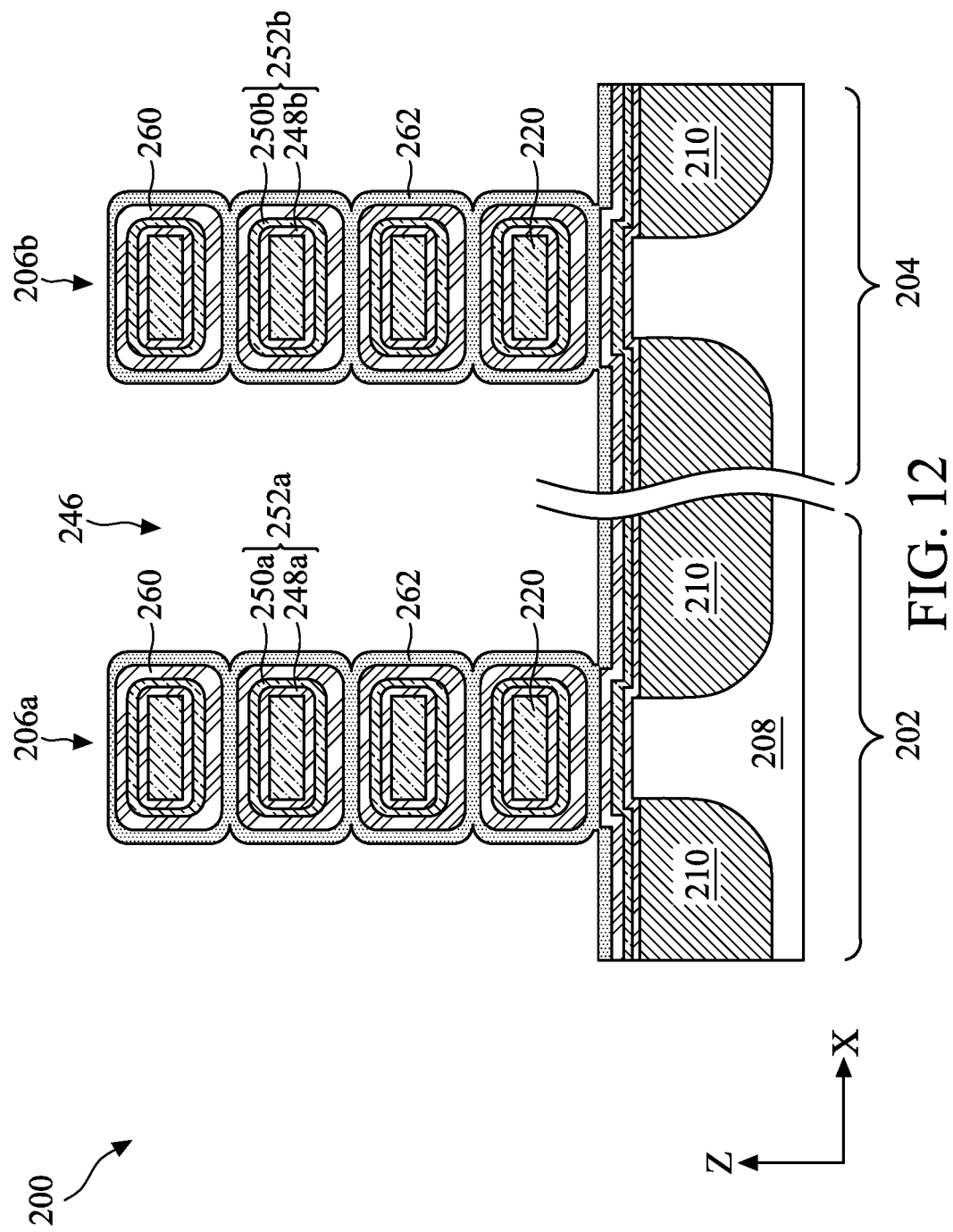

At operation 116, the method 100 (FIG. 2B) deposits a sacrificial layer 262 wrapping the thickness modulation layer 260, as shown in FIG. 12. In the illustrated embodiment, the sacrificial layer 262 fills the gap between adjacent wrapped nanosheets 220 and has a thickness about 2 Å to about 20 Å outside of the gap. The sacrificial layer 262 functions as a place holder and reserves the gap between adjacent wrapped nanosheets 220 to prevent chemicals used in subsequent processes (e.g., resist materials) from leaking into and sealing the relatively narrow gap. The sacrificial layer 262 may include one or more material layers. In the illustrated embodiment, the sacrificial layer 262 includes material(s) that exhibits strong gap filling capability in filling narrow gaps and good etching contrast which is relatively easier to remove in subsequent selective etching process. In some embodiments, the sacrificial layer 262 is a metal oxide layer. In furtherance of the embodiment, the sacrificial layer 262 includes AlO that is metal rich, such as Al:O ratio of about 1.05:1 or about 2:1. The deposition methods include physical vapor deposition, CVD, ALD, or other suitable methods.

Figure 13:
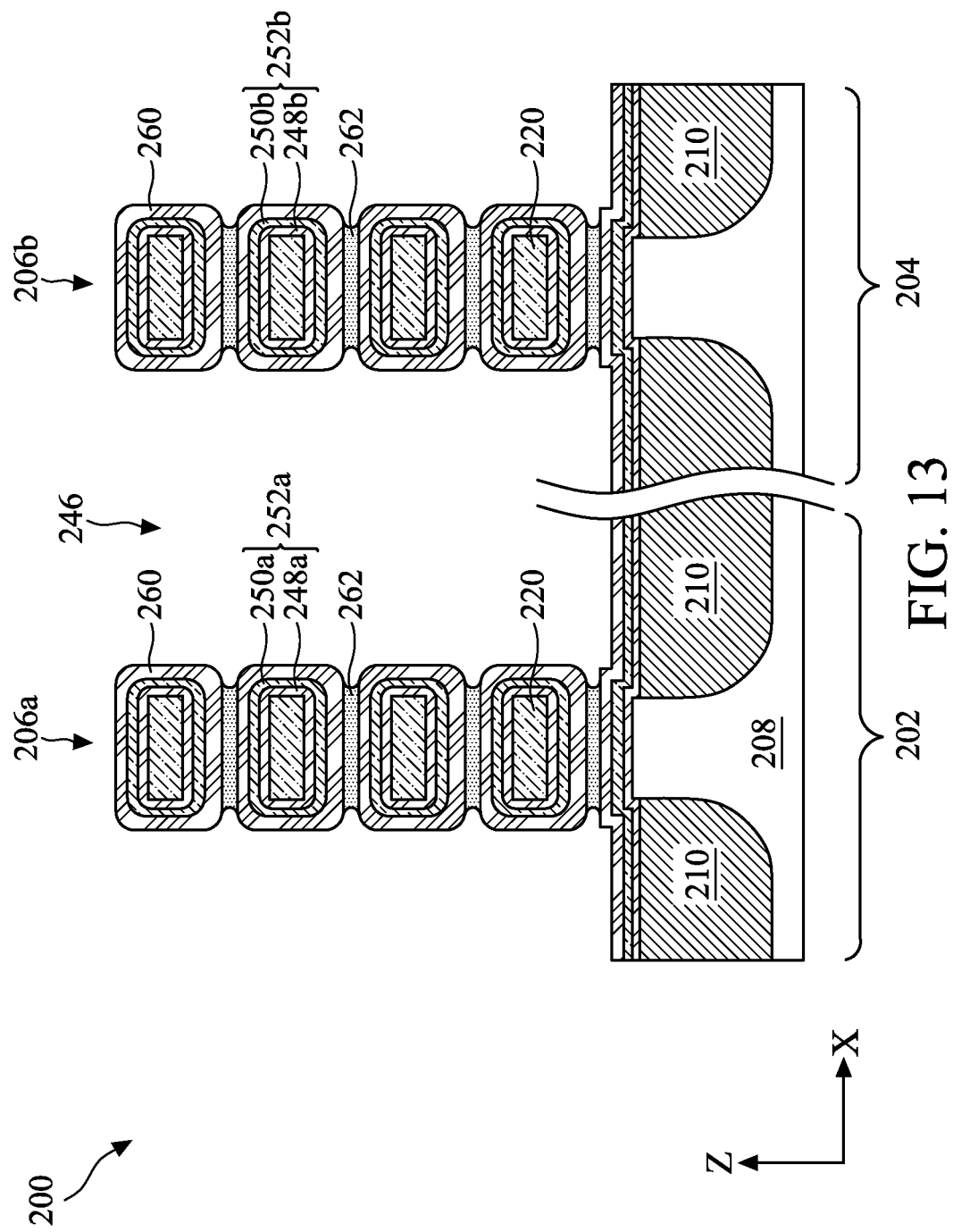

At operation 118, the method 100 (FIG. 2B) partially removes the sacrificial layer 262 from top and external sidewall surfaces of the GAA device structures 206a and 206b, where portions of the sacrificial layer 262 stacked between adjacent wrapped nanosheets 220 remain, as shown in FIG. 13. The sacrificial layer 262 may be removed, for example, by wet etching, dry etching, reactive ion etching, or other suitable etching methods. In one example, the sacrificial layer 262 is partially removed in an anisotropic etching process, such that portions of the sacrificial layer 262 stacked between adjacent wrapped nanosheets 220 is intact. In another example, the sacrificial layer 262 is partially removed in a wet etching process. The etching time is controlled (e.g., by a timer) such that portions of the sacrificial layer 262 stacked between adjacent wrapped nanosheets 220 are etched slower than other portions exposed outside of the gap due to loading effect and substantially remain.

Figure 14:
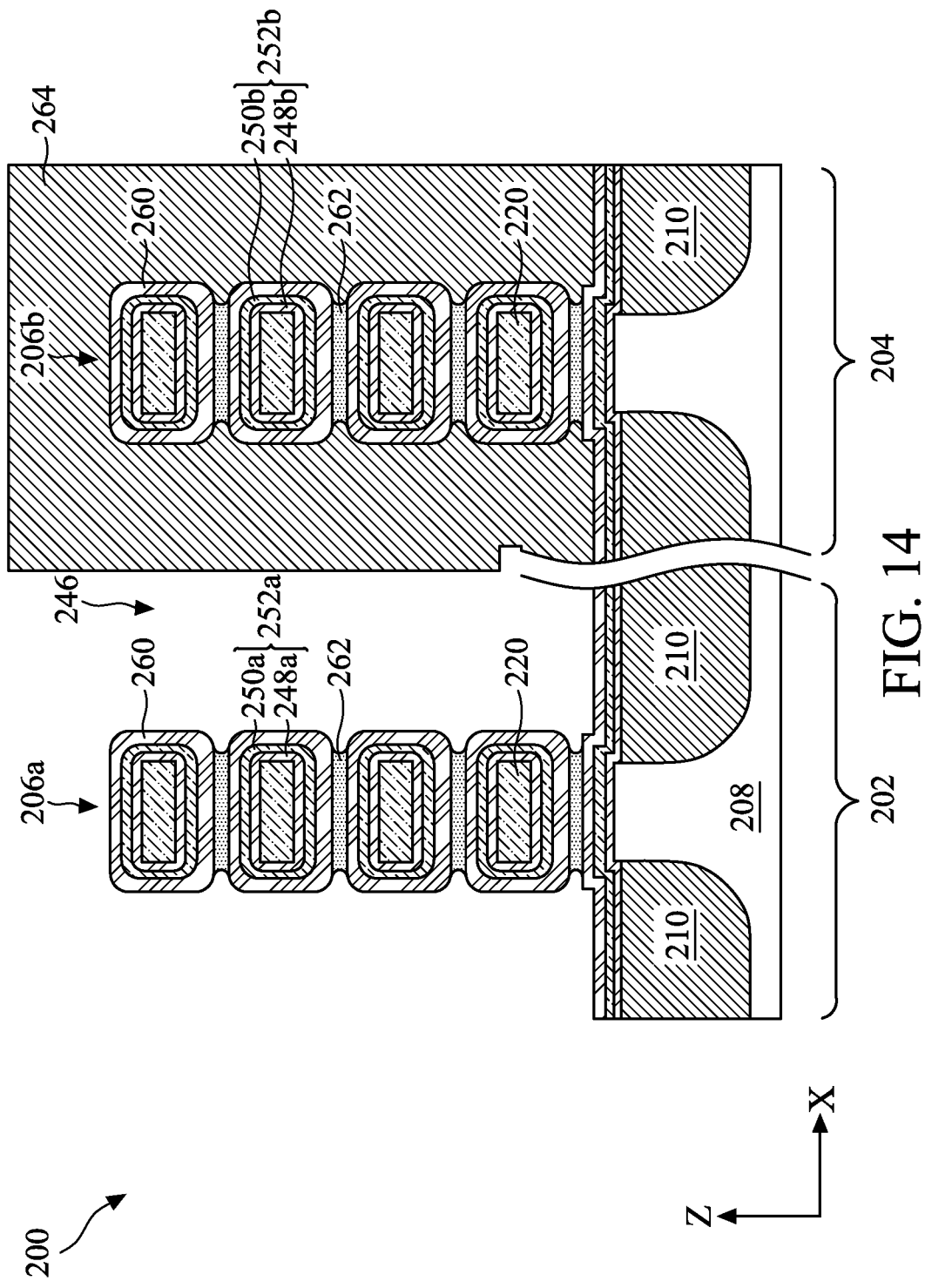

At operation 120, the method 100 (FIG. 2B) forms a patterned mask layer 264 covering the GAA I/O device structure 206b and exposing the GAA core device stricture 206a, as shown in FIG. 14. In some embodiments, the mask layer 264 is a photoresist layer, such as a bottom antireflective coating (BARC) layer. The remaining portions of the sacrificial layer 262 stacked between adjacent wrapped nanosheets 220 prevents resist material of the mask layer 264 from leaking into the gap, which is hard to remove. In forming the mask layer 264, operation 120 may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof.

Figure 15:
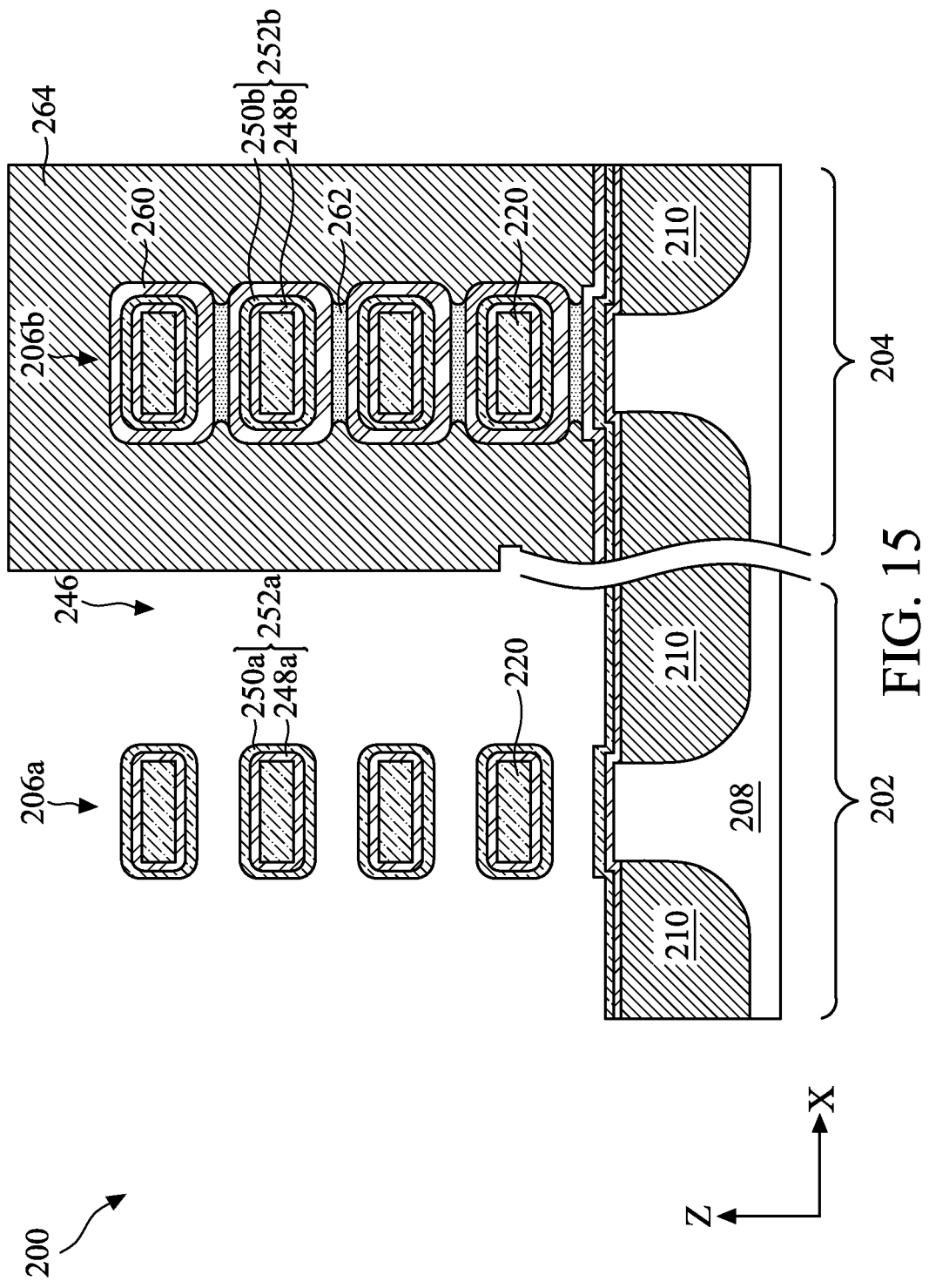
Figure 16:
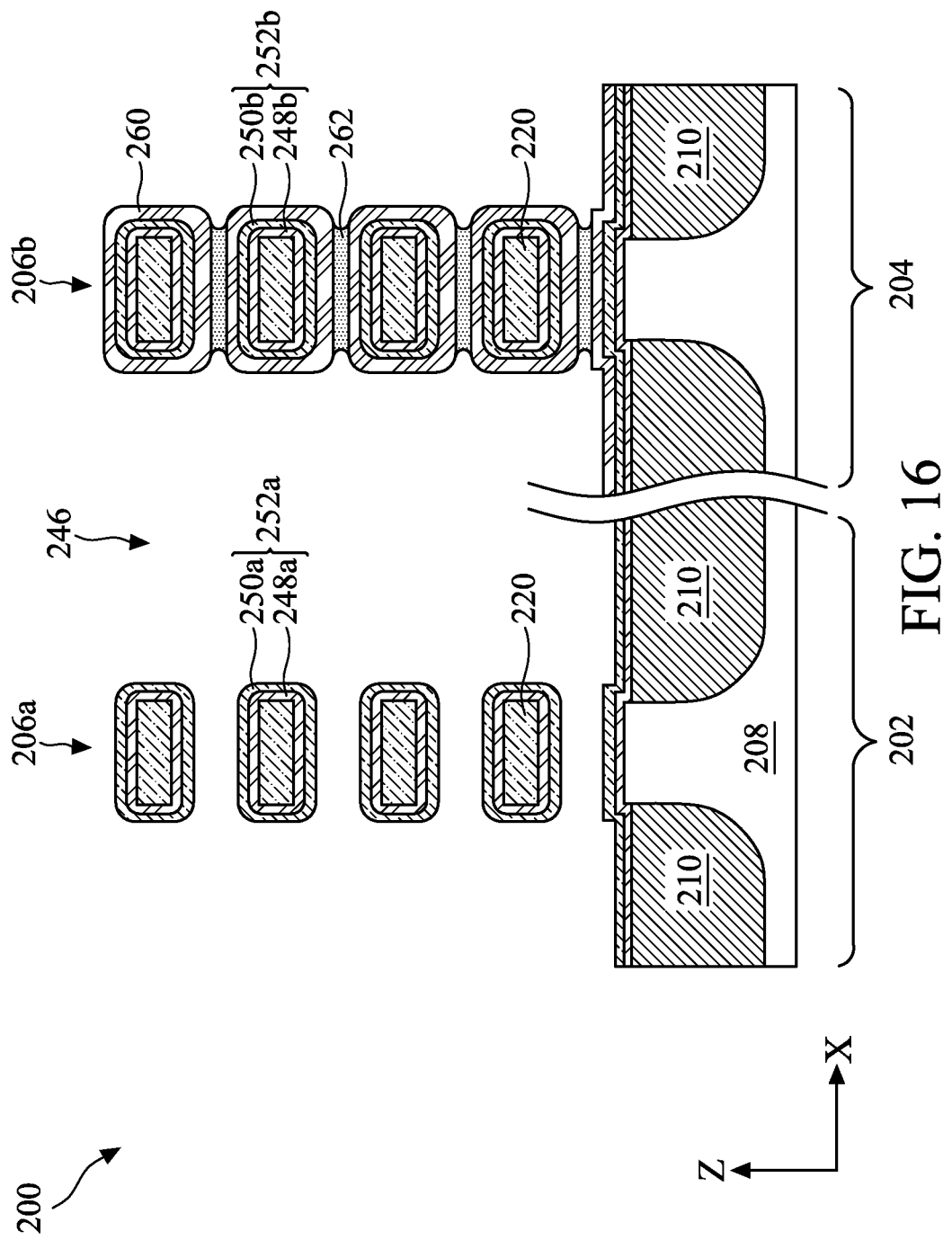

At operation 122, the method 100 (FIG. 2B) removes the thickness modulation layer 260 and the sacrificial layer 262 from the GAA core device structure 206a in an etching process, as shown in FIG. 15. The etching process may include any suitable etching technique such as wet etching, dry etching, RIE, ashing, and/or other etching methods. In an example, the etching process is a dry etching process using a fluorine-based etchant (e.g., $CF_4$, $CHF_3$, $CH_2F_2$, etc.) or a wet etching process using a HF-based wet etchant. After operation 122, mask layer 264 may be removed, such as by etching, ashing, or resist stripping. At this point, the thickness modulation layer 260 and the sacrificial layer 262 remain only in the GAA I/O device structure 206b, as shown in FIG. 16.

Figure 17:
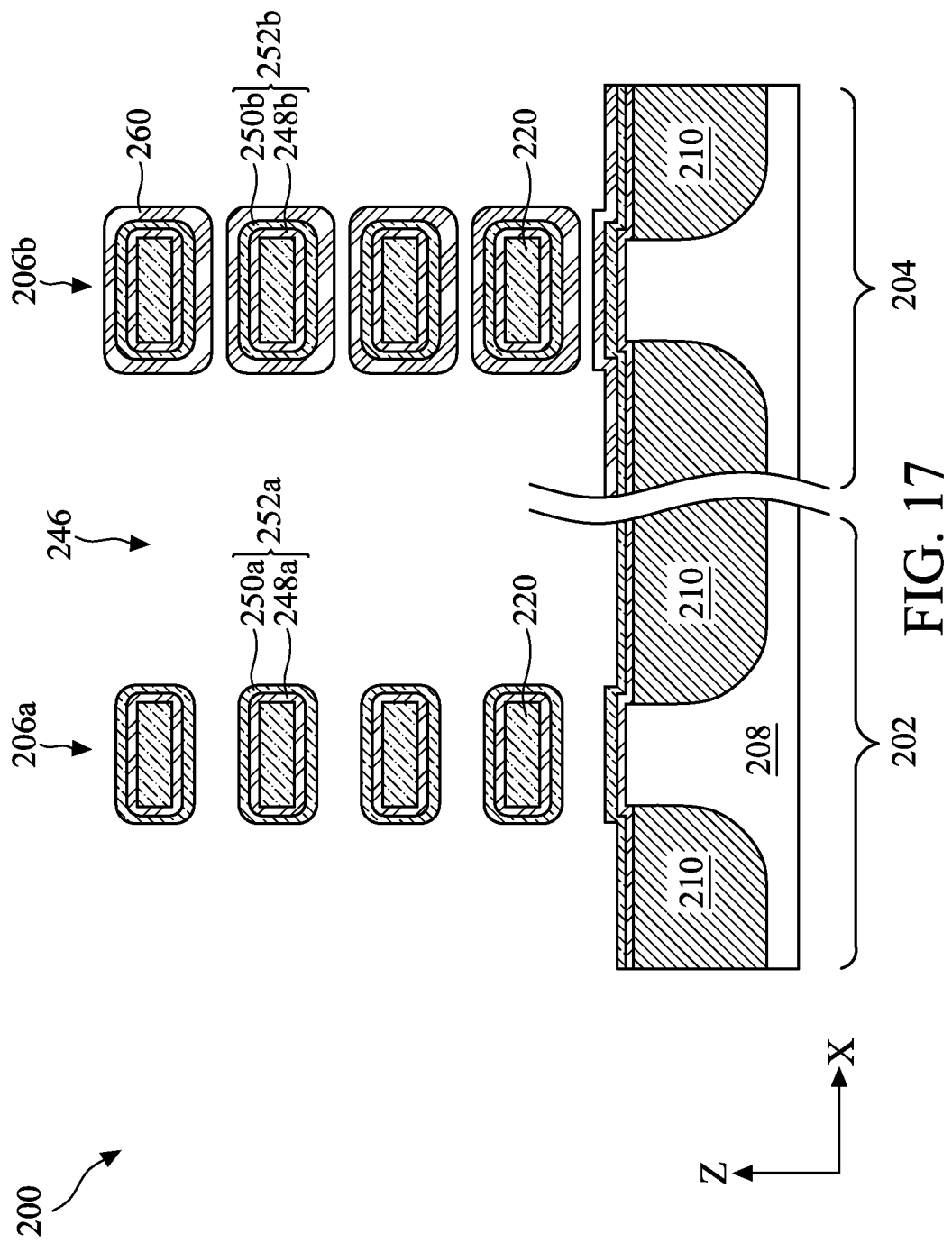

At operation 124, the remaining portions of the sacrificial layer 262 stacked between the gaps between adjacent wrapped nanosheets 220 is removed from the GAA I/O device structure 206b, as shown in FIG. 17. The sacrificial layer 262 may be removed, for example, by a wet etching process. In some embodiments, a wet etch process may comprise etching in diluted hydrofluoric acid (DHF), potassium hydroxide (KOH) solution, ammonia, a solution containing hydrofluoric acid (HF), nitric acid ($HNO_3$), and/or acetic acid ($CH_3COOH$), or other suitable wet etchants. At this point, the thickness modulation layer 260 wrapping the gate dielectric layers 252b remains only in the GAA I/O device structure 206b and is fully surrounded by ambient environment.

At operation 126, the method 100 (FIG. 2B) performs an annealing process (represented by arrows 270 in FIG. 18) to initiate an oxide regrowth process on the gate oxide layer 248b, such that outer portions of the crystalline silicon of the nanosheets 220 in the GAA I/O device structure 206b are consumed and chemically converted to silicon oxide. In some embodiments, a thickness of the overall oxide layer in the GAA I/O device structure 206b may increase about 30% to about 50%. The annealing process includes a spike annealing process having an oxygen-containing ambient environment, with an initial temperature between about 500° C. and about 700° C., and a peak temperature between about 700° C. and about 900° C. At elevated temperature, the thickness modulation layer 260 absorbs oxygen from ambient environment and transports oxygen into layers underneath through diffusion. The gap between adjacent wrapped channel members that was reserved previously by the sacrificial layer 262 allows the thickness modulation layer 260 to absorb oxygen substantially uniformly from all directions.

Figure 18:
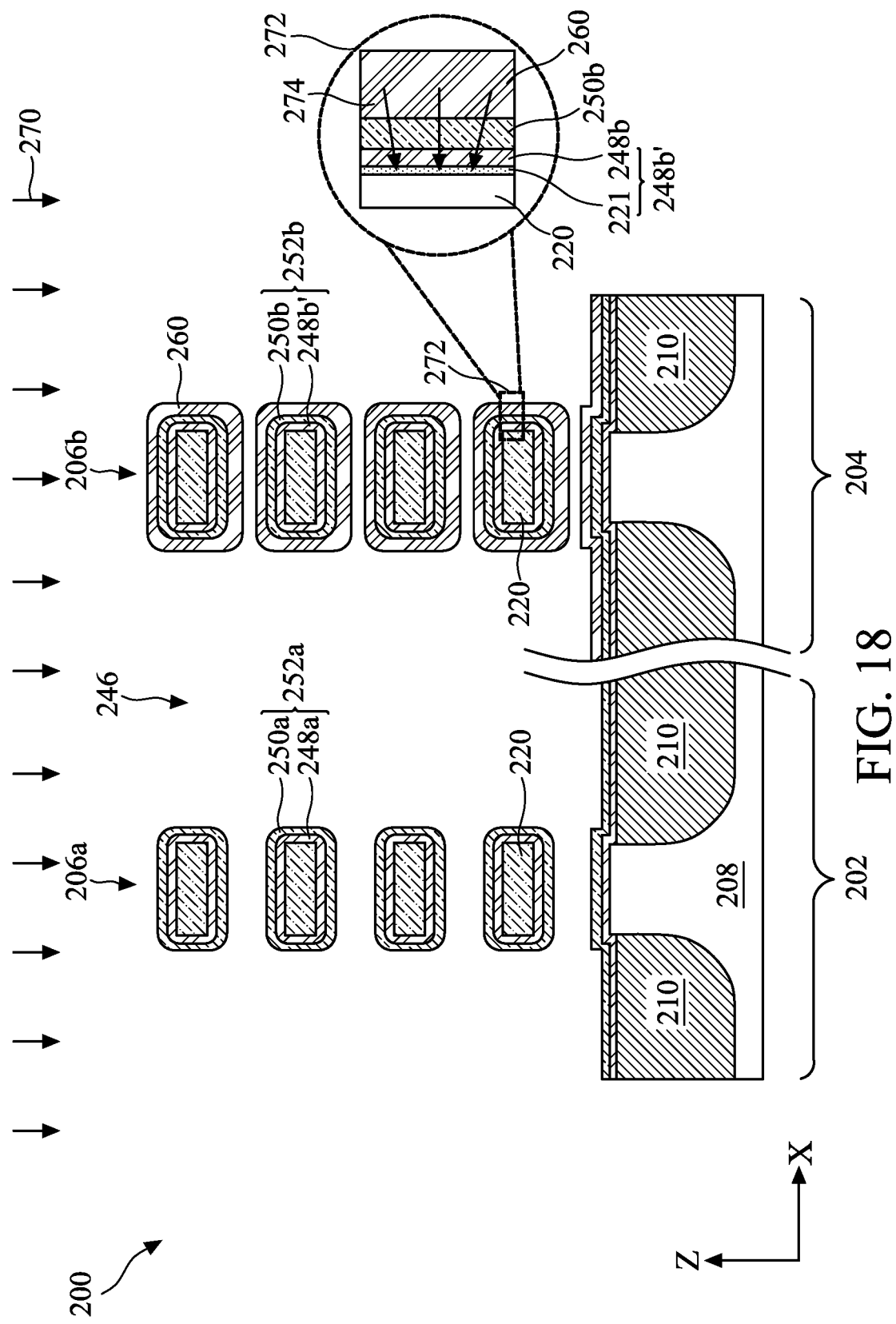

FIG. 18 also illustrates a magnified view of a region 272 in the I/O area 204. Arrows 274 are shown to indicate the movement of oxygen atoms in the region 272 due to the oxygen transportation by the thickness modulation layer 260. When oxygen atoms arrive at interfaces between the gate oxide layer 248b and the nanosheets 220, oxygen atoms chemically react with silicon atoms of the nanosheets 220 and form silicon oxide. Accordingly, an additional silicon oxide layer 221 is formed underneath the gate oxide layer 248b. The additional silicon oxide layer 221 is formed by consuming crystalline silicon in the outer portions of the nanosheets 220, resulting in shrunk dimensions in both width and height of the nanosheets 220 in the GAA I/O device structure 206b. In some embodiments, each of the width and height (in X-Z plane) of the channel members in the GAA I/O device structure 206b becomes about 1.5 Å to about 2.5 Å smaller than those in the GAA core device structure 206a. Compared with the gate oxide layer 248b, oxide composition in the additional silicon oxide layer 221 may have a less density due to different growing process. For example, the gate oxide layer 248b may have a silicon oxide density about 2.65 $g/cm^3$ as formed by a gas phase $H_2O_2$ chemical oxidation process, while the additional silicon oxide layer 221 may have a silicon oxide density about 2.55 $g/cm^3$ as formed by silicon consumption under the annealing process 270. In some embodiments, the additional silicon oxide layer 221 is an intermix compound of silicon oxide and silicon, such that silicon oxide has higher molar percentage closer to the gate oxide layer 248b and lower molar percentage away from the gate oxide layer 248b. In furtherance of the embodiments, the additional silicon oxide layer 221 is an intermix compound of silicon oxide and crystalline silicon. Alternatively, the intrusion of oxygen atoms into the crystalline lattice of silicon and the spike annealing process may destruct the crystalline lattice and result in an intermix compound of silicon oxide and poly-crystalline silicon or amorphous silicon. The gate oxide layer 248b and the additional silicon oxide layer 221 are collectively denoted as gate oxide layer 248b', which has an increased thickness compared with the gate oxide layer 248a in the core area 202.

The annealing process also causes the transportation of oxygen from the thickness modulation layer 260 into the high-k dielectric layer 250b. The high-k dielectric layer 250b may thus have a higher concentration of oxygen than that in the high-k dielectric layer 250a. Further, oxygen in molar percentage in the high-k dielectric layer 250b may have a gradient that is higher when closer to the thickness modulation layer 260 and is lower when away from the thickness modulation layer 260. During the annealing process, metal element in a bottom portion of the thickness modulation layer 260 may also intermix with a top portion of the high-k dielectric layer 250b to form an intermix compound. For example, when the high-k dielectric layer 254a comprises Hf and the thickness modulation layer 260 comprises Ti, the intermix compound may comprise an alloy oxide HfTiO. Further, during the annealing process, a bottom portion of the high-k dielectric layer 250b may intermix with a top portion of the gate oxide layer 248b to form a metal silicate. For example, when the high-k dielectric layer 250b comprises Hf, the metal silicate is hafnium silicate (HfSiO_4). In a particular example, after the annealing process, the high-k dielectric layer 250b includes a top portion comprising an alloy oxide (e.g., HfTiO), a middle portion comprising a high-k metal oxide (e.g., $HfO_2$), and a bottom portion comprising a metal silicate (e.g., HfSiO_4). As a comparison, the high-k dielectric layer 250a in the core area 202 comprises a high-k metal oxide (e.g., $HfO_2$) that is substantially uniformly distributed.

Figure 19:
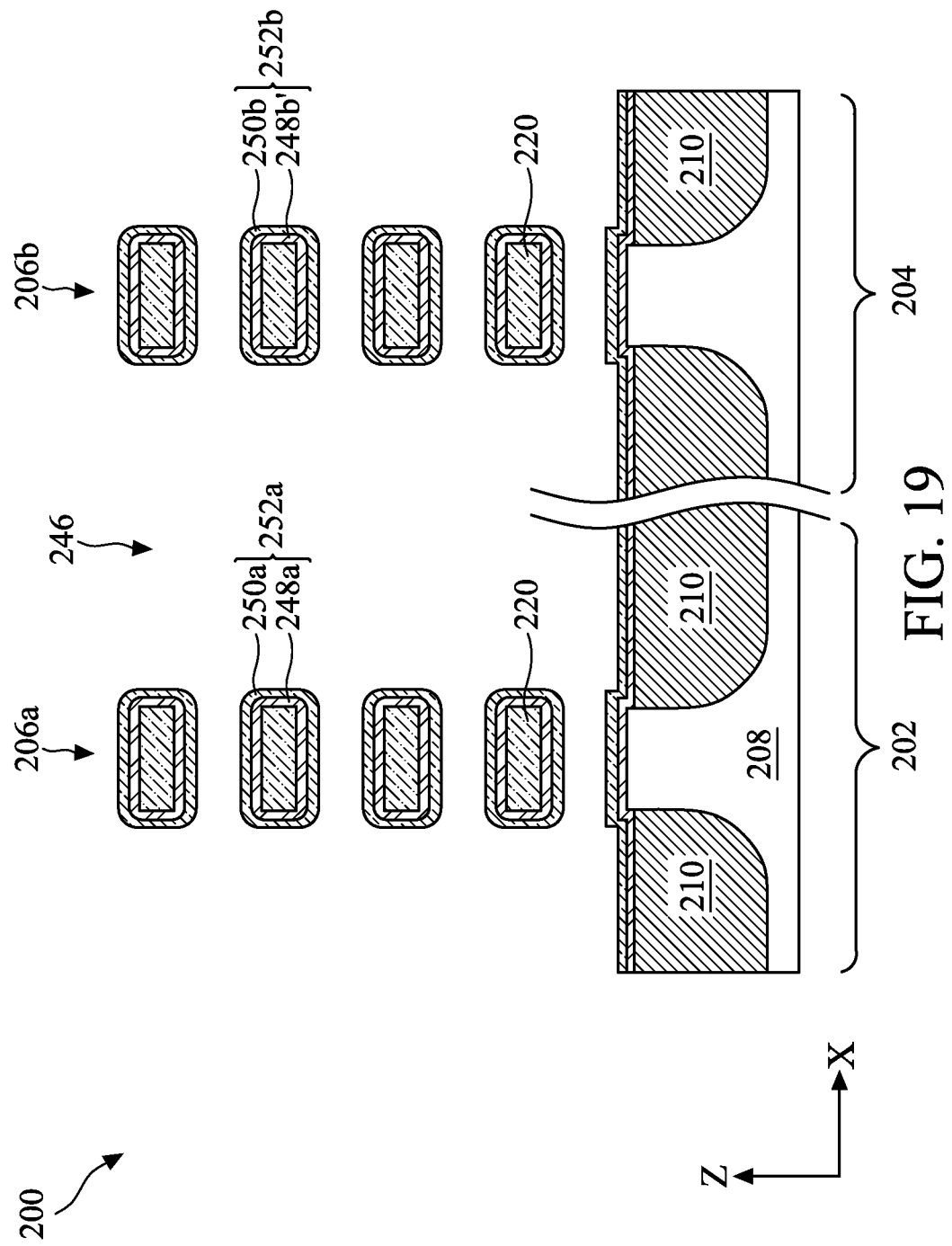
Figure 20:
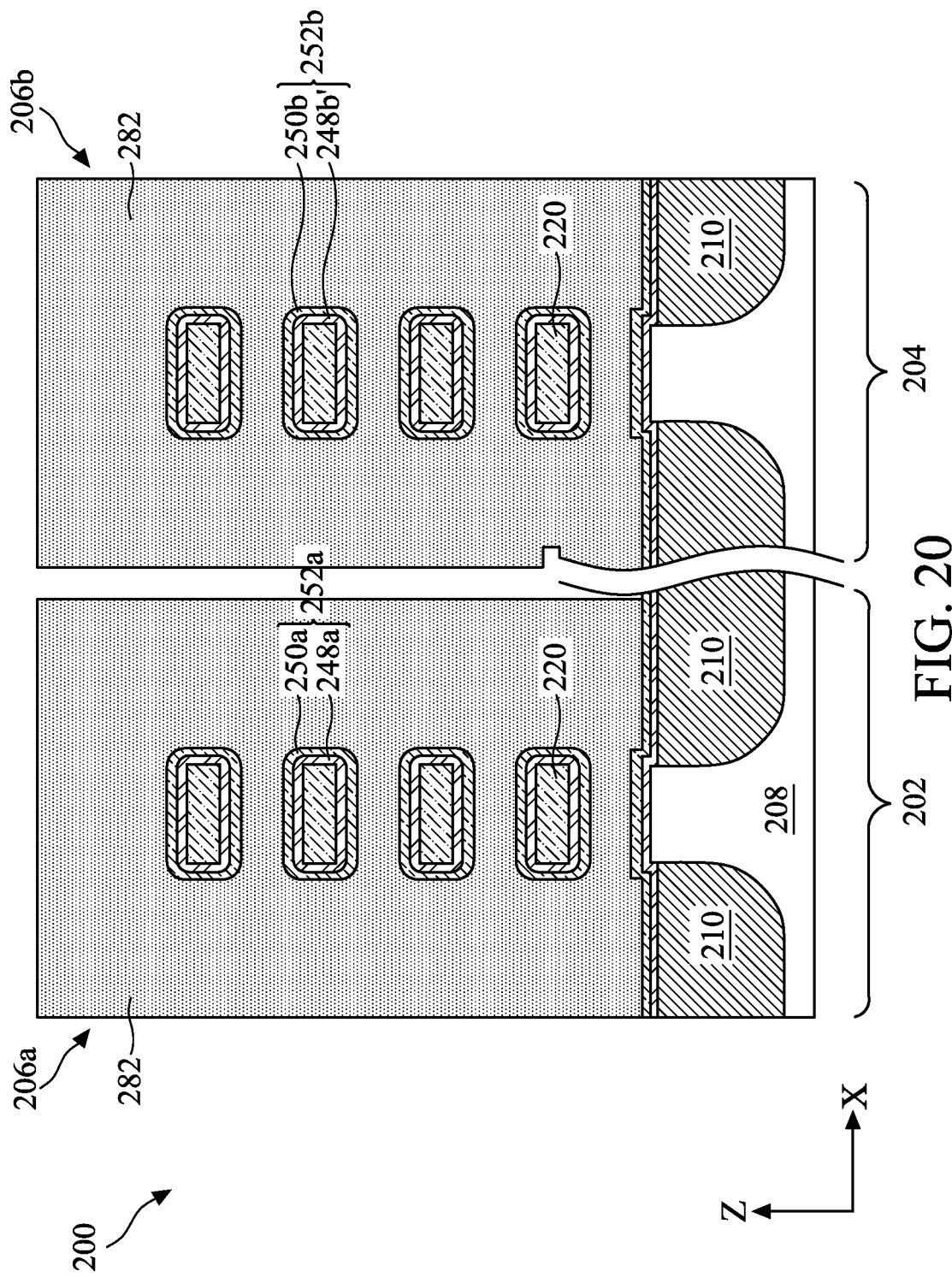

At operation 128, the method 100 (FIG. 2B) removes the thickness modulation layer 260 in a selective etching process, exposing the gate dielectric layers 252a and 252b in the gate trenches 246, as shown in FIG. 19. The selective etching process can include dry etching, wet etching, reactive ion etching (RIE), and/or other suitable processes. With various thickness of the gate oxide layers 248a and 248b', consequently, the gate dielectric layer 252a in the core area 202 has a thickness smaller than that of the gate dielectric layer 252b in the I/O area 204.

At operation 130, the method 100 (FIG. 2B) forms a gate electrode layer 282 in the gate trenches 246, wrapping the gate dielectric layers 252a and 252b in the core area 202 and the I/O area 204, respectively. The gate electrode layer 282 is a conductive layer that includes one or more metal layers, such as work function metal layer(s), conductive barrier layer(s), and metal fill layer(s). The gate electrode layer 282 may be formed separately for n-type and p-type transistors which may use different metal layers. The work function metal layer may be a p-type or an n-type work function layer. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), titanium silicon nitride (TiSiN), or combinations thereof. The gate electrode layer 282 may comprise multiple work function metal layers, such as a first metal layer and a second metal layer. As an example, the first metal layer may include TiN, and the second metal layer may include TiAl or other combinations of Ti, Ta, C, Al, such as TiAlC or TaAlC. The gate electrode layer 282 also includes a metal fill layer. The metal fill layer may include aluminum (Al), tungsten (W), cobalt (Co), and/or other suitable materials. In various embodiments, the metal fill layer of the gate electrode layer 282 may be formed by plating, ALD, PVD, CVD, e-beam evaporation, or other suitable process. In various embodiments, a CMP process may be performed to remove excessive metal from the metal layer of the gate stack, and thereby provide a substantially planar top surface.

At operation 132 of the method 100 (FIG. 2B), the semiconductor device 200 may undergo further processing to form various features and regions known in the art. For example, subsequent processing may form contact openings, contact metal, as well as various contacts/vias/lines and multilayers interconnect features (e.g., metal layers and interlayer dielectrics), configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Although not intended to be limiting, one or more embodiments of the present disclosure provide many benefits to a semiconductor device and the formation thereof. For example, embodiments of the present disclosure provide multi-gate high-speed transistors and multi-gate high-voltage transistors on the same substrate and in the same integrated circuit. The multi-gate high-speed transistors, such as GAA high-speed transistors, are placed in a core area of the IC for implementing high-speed circuits or SRAM memories, while the multi-gate high-voltage transistors, such as GAA high-voltage transistors, are placed in an I/O area of the IC for implementing I/O circuits or ESD circuits. The multi-gate high-speed devices and multi-gate high-voltage devices have various gate oxide thicknesses to create performance difference in different areas. The present embodiments enable circuit designers to optimize the circuits in different areas of the IC by choosing different gate oxide thicknesses.

In one exemplary aspect, the present disclosure is directed to a method. The method includes a method. The method includes providing a structure having a first channel member and a second channel member over a substrate, wherein the first channel member is located in a first region of the structure and the second channel member is located in a second region of the structure; forming a first oxide layer over the first channel member and a second oxide layer over the second channel member; forming a first dielectric layer over the first oxide layer and a second dielectric layer over the second oxide layer; forming a capping layer over the second dielectric layer but not over the first dielectric layer; and performing an annealing process to increase a thickness of the second oxide layer under the capping layer. In some embodiments, the forming of the capping layer includes depositing the capping layer over the first and second dielectric layers; forming a patterned mask covering a portion of the capping layer over the second dielectric layer; and removing another portion of the capping layer from the first dielectric layer. In some embodiments, the method further includes depositing a sacrificial layer over the capping layer; and etching vertical portions of the sacrificial layer, while a first horizontal portion of the sacrificial layer in the first region and a second horizontal portion of the sacrificial layer in the second region remain substantially intact. In some embodiments, the method further includes after the etching of the vertical portions of the sacrificial layer, forming a patterned mask covering the capping layer over the second dielectric layer and the first horizontal portion of the sacrificial layer; and etching the second horizontal portion of the sacrificial layer. In some embodiments, the sacrificial layer is a metal oxide layer. In some embodiments, the capping layer is a metal nitride layer. In some embodiments, the performing of the annealing process includes a spike annealing process having an oxygen-containing ambient environment, an initial temperature between about 500 degrees Celsius and about 700 degrees Celsius, and a peak temperature between about 700 degrees Celsius and about 900 degrees Celsius. In some embodiments, the forming of the first and second oxide layers process includes a treatment of the first and second channel members with $H_2O_2$. In some embodiments, the first region is a core region of the structure and the second region is an input/output (I/O) region of the structure. In some embodiments, after the performing of the annealing process, the thickness of the second oxide layer is about 30% to about 50% larger than that of the first oxide layer.

In another exemplary aspect, the present disclosure is directed to a method. The method includes forming a plurality of first suspended layers in a first fin and a plurality of second suspended layers in a second fin; forming a first interfacial layer wrapping around the first suspended layers in the first fin and a second interfacial layer wrapping around the second suspended layers in the second fin; forming a first high-k dielectric layer wrapping around the first interfacial layer and a second high-k dielectric layer wrapping around the second interfacial layer; depositing a metal layer wrapping around the first and second high-k dielectric layers; removing the metal layer from the first high-k dielectric layer; performing an annealing process, wherein during the annealing process, oxygen in an ambient environment is driven through the metal layer, the second high-k dielectric layer, and the second interfacial layer and arrives at an outer portion of the second suspended layers, such that the outer portion of the second suspended layers is converted to an oxide layer; and depositing a first gate electrode layer wrapping around the first high-k dielectric layer and a second gate electrode layer wrapping around the second high-k dielectric layer. In some embodiments, the method further includes after the performing of the annealing process, removing the metal layer from the second high-k dielectric layer. In some embodiments, the method further includes prior to the removing of the metal layer from the first high-k dielectric layer, depositing a sacrificial layer filling gaps between adjacent second suspended layers; and forming a patterned mask covering the second fin. In some embodiments, after the depositing of the sacrificial layer, the sacrificial layer also fills gaps between adjacent first suspended layers. In some embodiments, the metal layer includes one of TiN, AlN, TiALN, WN, and TiAlC. In some embodiments, the oxide layer converted from the outer portion of the second suspended layer has a thickness about 30% to about 50% of a thickness of the first interfacial layer.

In another exemplary aspect, the present disclosure is directed to an integrated circuit. The integrated circuit includes a substrate having a first region and a second region; a first gate-all-around (GAA) device located in the first region, the first GAA device including a first channel member extending longitudinally in a first direction, and a first gate structure wrapping a channel region of the first channel member, the first gate structure including a first interfacial layer; and a second GAA device located in the second region, the second GAA device including a second channel member extending longitudinally in the first direction, and a second gate structure wrapping a channel region of the second channel member, the second gate structure including a second interfacial layer, the second interfacial layer having a first portion adjacent the second channel member and a second portion over the first portion, the first portion having a density less than that of the second portion. In some embodiments, the first portion of the second interfacial layer has a first thickness measured in a first direction generally perpendicular to the first direction, the second portion of the second interfacial layer has a second thickness measured in the second direction, and the first interfacial layer has a third thickness measured in the second direction, and wherein the second thickness substantially equals the third thickness. In some embodiments, the first thickness is about 30% to about 50% of the second thickness. In some embodiments, the first portion of the second interfacial layer is a compound layer of silicon oxide and silicon.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a structure having a first channel member and a second channel member over a substrate, wherein the first channel member is located in a first region of the structure and the second channel member is located in a second region of the structure;
forming a first oxide layer over the first channel member and a second oxide layer over the second channel member;
forming a first dielectric layer over the first oxide layer and a second dielectric layer over the second oxide layer;
forming a capping layer over the second dielectric layer but not over the first dielectric layer; and
performing an annealing process while the first dielectric layer is exposed to increase a thickness of the second oxide layer under the capping layer.

2. The method of claim 1, wherein the forming of the capping layer includes:
depositing the capping layer over the first and second dielectric layers;
forming a patterned mask covering a portion of the capping layer over the second dielectric layer; and
removing another portion of the capping layer from the first dielectric layer.

3. The method of claim 1, further comprising:
depositing a sacrificial layer over the capping layer; and
etching vertical portions of the sacrificial layer, while a first horizontal portion of the sacrificial layer in the first region and a second horizontal portion of the sacrificial layer in the second region remain substantially intact.

4. The method of claim 3, further comprising:
after the etching of the vertical portions of the sacrificial layer, forming a patterned mask covering the capping layer over the second dielectric layer and the first horizontal portion of the sacrificial layer; and
etching the second horizontal portion of the sacrificial layer.

5. The method of claim 3, wherein the sacrificial layer is a metal oxide layer.

6. The method of claim 1, wherein the capping layer is a metal nitride layer.

7. The method of claim 1, wherein the performing of the annealing process includes a spike annealing process having an oxygen-containing ambient environment, an initial temperature between about 500 degrees Celsius and about 700 degrees Celsius, and a peak temperature between about 700 degrees Celsius and about 900 degrees Celsius.

8. The method of claim 1, wherein the forming of the first and second oxide layers includes a treatment of the first and second channel members with $H_2O_2$.

9. The method of claim 1, wherein the first region is a core region of the structure and the second region is an input/output (I/O) region of the structure.

10. The method of claim 9, wherein after the performing of the annealing process, the thickness of the second oxide layer is about 30% to about 50% larger than that of the first oxide layer.

11. A method, comprising:
forming a plurality of first suspended layers in a first fin and a plurality of second suspended layers in a second fin;
forming a first interfacial layer wrapping around the first suspended layers in the first fin and a second interfacial layer wrapping around the second suspended layers in the second fin;
forming a first high-k dielectric layer wrapping around the first interfacial layer and a second high-k dielectric layer wrapping around the second interfacial layer;
depositing a metal layer wrapping around the first and second high-k dielectric layers;
removing the metal layer from the first high-k dielectric layer;
performing an annealing process, wherein during the annealing process, oxygen in an ambient environment is driven through the metal layer, the second high-k dielectric layer, and the second interfacial layer and arrives at an outer portion of the second suspended layers, such that the outer portion of the second suspended layers is converted to an oxide layer; and
depositing a first gate electrode layer wrapping around the first high-k dielectric layer and a second gate electrode layer wrapping around the second high-k dielectric layer.

12. The method of claim 11, further comprising:
after the performing of the annealing process, removing the metal layer from the second high-k dielectric layer.

13. The method of claim 11, prior to the removing of the metal layer from the first high-k dielectric layer, further comprising:
depositing a sacrificial layer filling gaps between adjacent second suspended layers; and
forming a patterned mask covering the second fin.

14. The method of claim 13, wherein after the depositing of the sacrificial layer, the sacrificial layer also fills gaps between adjacent first suspended layers.

15. The method of claim 11, wherein the metal layer includes one of TiN, AlN, TiALN, WN, and TiAlC.

16. The method of claim 11, wherein the oxide layer converted from the outer portion of the second suspended layer has a thickness about 30% to about 50% of a thickness of the first interfacial layer.

17. An integrated circuit, comprising:
a substrate having a first region and a second region;
a first gate-all-around (GAA) device located in the first region, the first GAA device including:
a first channel member extending longitudinally in a first direction, and
a first gate structure wrapping a channel region of the first channel member, the first gate structure including a first interfacial layer; and
a second GAA device located in the second region, the second GAA device including:
a second channel member extending longitudinally in the first direction, and
a second gate structure wrapping a channel region of the second channel member, the second gate structure including a second interfacial layer, the second interfacial layer having a first portion adjacent the second channel member and a second portion over the first portion, the first portion having a weight density less than that of the second portion.

18. The integrated circuit of claim 17, wherein the first portion of the second interfacial layer has a first thickness measured in a second direction generally perpendicular to the first direction, the second portion of the second interfacial layer has a second thickness measured in the second direction, and the first interfacial layer has a third thickness measured in the second direction, and wherein the second thickness substantially equals the third thickness.

19. The integrated circuit of claim 18, wherein the first thickness is about 30% to about 50% of the second thickness.

20. The integrated circuit of claim 17, wherein the first portion of the second interfacial layer is a compound layer of silicon oxide and silicon.

* * * * *